(12) United States Patent
Steyn et al.

(10) Patent No.: US 12,083,069 B1
(45) Date of Patent: Sep. 10, 2024

(54) SWITCHES FOR MEDICATION CONTAINER CAPS

(71) Applicant: Verily Life Sciences LLC, South San Francisco, CA (US)

(72) Inventors: Jasper Lodewyk Steyn, San Bruno, CA (US); Jaeden Hutchison, Oakland, CA (US)

(73) Assignee: VERILY LIFE SCIENCES LLC, Dallas, TX (US)

( * ) Notice: Subject to any disclaimer, the term of this patent is extended or adjusted under 35 U.S.C. 154(b) by 482 days.

(21) Appl. No.: 17/406,952

(22) Filed: Aug. 19, 2021

Related U.S. Application Data

(60) Provisional application No. 62/706,499, filed on Aug. 20, 2020.

(51) Int. Cl.
*G04B 37/12* (2006.01)
*A61J 1/03* (2023.01)
*G04F 1/00* (2006.01)
*H05K 1/11* (2006.01)
*H05K 7/14* (2006.01)

(52) U.S. Cl.
CPC .............. *A61J 1/03* (2013.01); *G04B 37/12* (2013.01); *G04F 1/005* (2013.01); *H05K 1/11* (2013.01); *H05K 7/1427* (2013.01); *A61J 2200/70* (2013.01); *H05K 2201/10053* (2013.01)

(58) Field of Classification Search
CPC ................................ A63F 3/02; G04G 21/08; H05K 2201/10053; H05K 7/14; H05K 1/11; A61J 1/03; A61J 7/0076; A61J 2200/70; H01H 3/16; H01H 3/161; H01H 13/52; G04F 1/005; G04B 37/12
See application file for complete search history.

(56) References Cited

U.S. PATENT DOCUMENTS

| 5,313,439 A | 5/1994 | Albeck | |
|---|---|---|---|
| 6,084,504 A * | 7/2000 | Rosche | A61J 7/0472 222/638 |
| 8,391,104 B2 * | 3/2013 | de la Huerga | A61J 1/1437 235/375 |

(Continued)

OTHER PUBLICATIONS

U.S. Appl. No. 17/406,979, "Non-Final Office Action", Jun. 8, 2023, 9 pages.

*Primary Examiner* — Sean Kayes
(74) *Attorney, Agent, or Firm* — Kilpatrick Townsend & Stockton LLP

(57) ABSTRACT

One example cap assembly includes a printed circuit board ("PCB") having first and second electrical contacts; a switch coupled to the PCB at the first electrical contact, the switch comprising a switching member comprising: a coupling feature coupling a first end of the switching member to the PCB at the first electrical contact; a first portion extending adjacent to the first side of the PCB from the coupling feature; a second portion extending through an opening through the PCB; and a third portion extending adjacent to the second side of the PCB; a second electrical contact formed on the second side of the PCB; wherein: the third portion of the switching member contacts the second electrical contact in a rest position, the third portion biased towards the rest position; and deflection of the first portion towards the PCB causes the third portion to break contact with the second electrical contact.

24 Claims, 13 Drawing Sheets

(56) References Cited

U.S. PATENT DOCUMENTS

| | | |
|---|---|---|
| 8,842,501 B2 | 9/2014 | Ziemba et al. |
| 2003/0198134 A1 | 10/2003 | Hildebrandt |
| 2008/0117719 A1* | 5/2008 | Hildebrandt .......... A61J 7/0472 |
| | | 368/10 |
| 2009/0294521 A1 | 12/2009 | De La Huerya |
| 2013/0021878 A1 | 1/2013 | Harris |
| 2015/0095047 A1* | 4/2015 | Burrows ................ A61J 7/0436 |
| | | 206/534 |
| 2016/0086750 A1* | 3/2016 | Loewen ................. H01H 23/04 |
| | | 200/557 |
| 2017/0239146 A1* | 8/2017 | Bomhoff ................ A61J 7/0076 |
| 2018/0280246 A1 | 10/2018 | Cohen et al. |
| 2019/0278234 A1* | 9/2019 | Tsuchiya ............... H04W 12/06 |
| 2021/0382295 A1* | 12/2021 | Booker ................. G02B 25/002 |

* cited by examiner

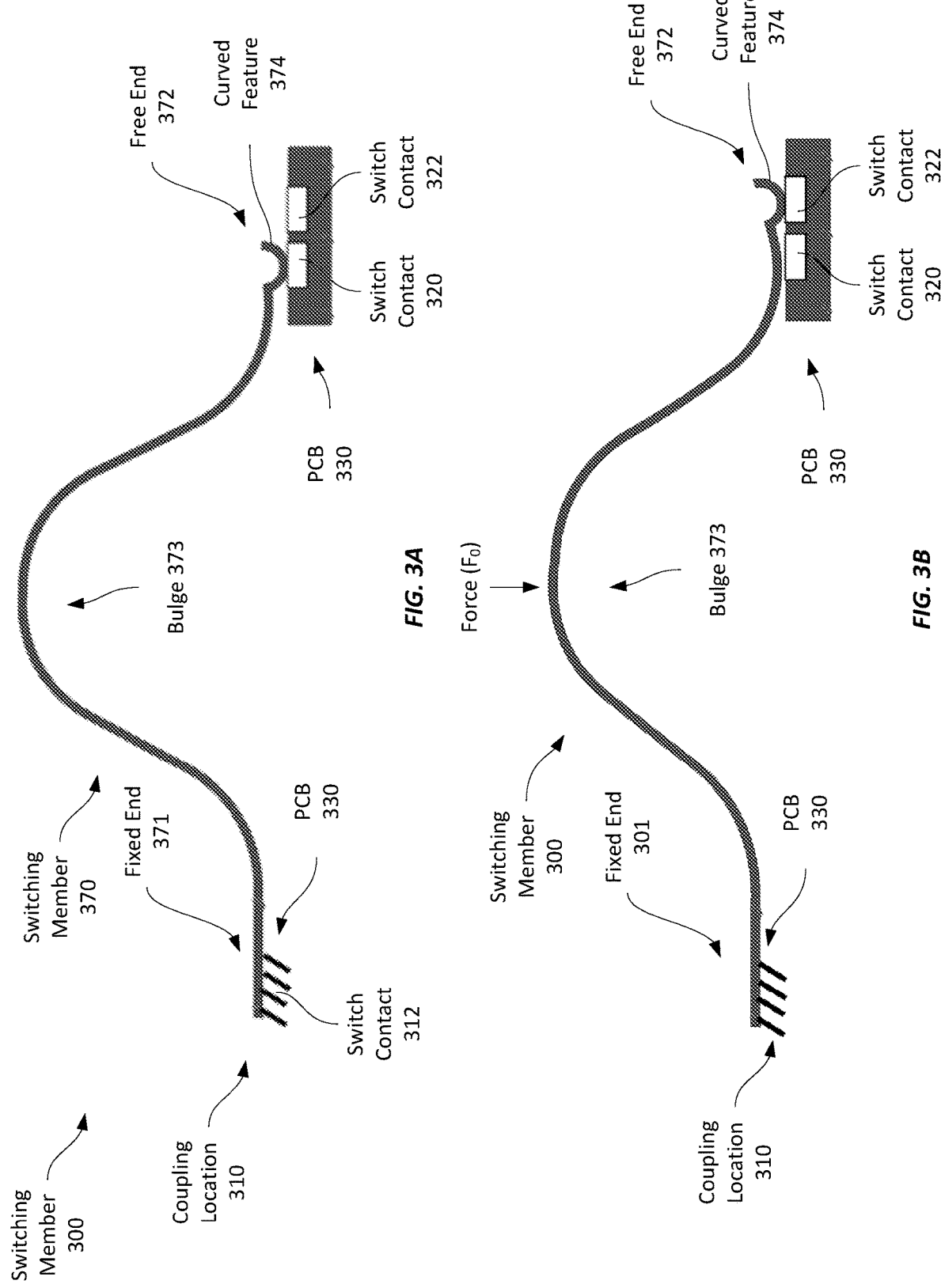

SWITCHES FOR MEDICATION CONTAINER CAPS

CROSS-REFERENCE TO RELATED APPLICATIONS

The present application claims the benefit of U.S. Provisional Patent Application 62/706,499, filed Aug. 20, 2020, the entirety of which is hereby incorporated by reference, and is related to U.S. Provisional Patent Application No. 62/706,498, filed Aug. 20, 2020, titled "Dosing Labels for Electronic Medication Container Caps," and U.S. patent application Ser. No. 17/406,979, filed Aug. 19, 2021, titled "Dosing Labels for Electronic Medication Container Caps," filed concurrently herewith.

FIELD

The present application generally relates to medication containers and more particular relates to switches for medication container caps.

BACKGROUND

Medications, such as pills, are distributed to consumers in a variety of different forms. For example, pills may be inserted into sheets of blister packs with plastic or foil backing. When a user wishes to use a pill, she can tear one of the blister packs from the sheet and remove the backing to remove the pill. In other cases, medication such as capsules or pills may be dispensed into a bottle with a twist or screw top. The user can then unscrew the top from the bottle, remove a dose of the medication, and then screw the top back onto the bottle to re-seal the contents within the bottle.

SUMMARY

Various examples are described for switches for pill container caps. One example medication container includes a storage portion enclosing a volume to store medication and having an opening providing access to the volume, and a cap configured to releasably couple to and seal the storage portion, the cap comprising: a printed circuit board ("PCB") having first and second sides and a set of electrical contacts comprising first and second electrical contacts; a mechanical switch physically coupled to the PCB at a first electrical contact formed on the PCB, the mechanical switch comprising a switching member, the switching member comprising: a coupling feature physically coupling a first end of the switching member to the PCB at the first electrical contact; a first portion extending adjacent to the first side of the PCB from the coupling feature; a second portion extending from the first portion through an opening through the PCB; and a third portion extending from the second portion and adjacent to the second side of the PCB; a second electrical contact formed on the second side of the PCB; a signal source coupled to the other of the first or second electrical contacts; a press plate positioned adjacent to the first portion of the switching member and the first side of the PCB, wherein the press plate applies a deflection force to the first portion of the switching member towards the PCB when the cap is coupled to the storage portion; wherein: the third portion of the switching member contacts the second electrical contact in a rest position to establish an electrical connection between the first and second electrical contacts, the third portion of the switching member is biased towards the rest position based on a deformation of the coupling feature or the first portion; and deflection of the first portion towards the PCB causes the third portion to break contact with the second electrical contact.

An example method includes sealing a medication container, by coupling a cap of the medication container comprising a cap to a storage portion of the medication container; changing a state of a mechanical switch based on the sealing of a medication container; in response to the switch changing state, activating a timer disposed within the cap; and activating a visual indicator based on an elapsed time since the activation of the timer reaching a pre-determined threshold, wherein the cap comprises: a printed circuit board ("PCB") having first and second sides and a set of electrical contacts comprising first and second electrical contacts; the mechanical switch, the mechanical switch physically coupled to the PCB at a first electrical contact formed on the PCB and comprising a switching member, the switching member comprising: a coupling feature physically coupling a first end of the switching member to the PCB at the first electrical contact; a first portion extending adjacent to the first side of the PCB from the coupling feature; a second portion extending from the first portion through an opening through the PCB; and a third portion extending from the second portion and adjacent to the second side of the PCB; a second electrical contact formed on the second side of the PCB; a signal source coupled to the other of the first or second electrical contacts; a timer physically coupled to the PCB and electrically coupled to one of the first or the second electrical contacts; a press plate positioned adjacent to the first portion of the switching member and the first side of the PCB, wherein the press plate applies a deflection force to the first portion of the switching member towards the PCB when the cap is coupled to the storage portion; wherein the third portion of the switching member contacts the second electrical contact in a rest position to establish an electrical connection between the first and second electrical contacts, the third portion of the switching member is biased towards the rest position based on a deformation of the coupling feature or the first portion; and deflection of the first portion towards the PCB causes the third portion to break contact with the second electrical contact.

Another example method includes receiving a first signal indicating a cap of a medication container has been coupled to a storage portion, the first signal generated in response to changing a state of a mechanical switch, wherein the cap comprises: a printed circuit board ("PCB") having first and second sides and a set of electrical contacts comprising first and second electrical contacts; the mechanical switch, the mechanical switch physically coupled to the PCB at a first electrical contact formed on the PCB and comprising a switching member, the switching member comprising: a coupling feature physically coupling a first end of the switching member to the PCB at the first electrical contact; a first portion extending adjacent to the first side of the PCB from the coupling feature; a second portion extending from the first portion through an opening through the PCB; a third portion extending from the second portion and adjacent to the second side of the PCB; and a second electrical contact formed on the second side of the PCB; a signal source coupled to the other of the first or second electrical contacts; a press plate positioned adjacent to the first portion of the switching member and the first side of the PCB, wherein the press plate applies a deflection force to the first portion of the switching member towards the PCB when the cap is coupled to the storage portion; wherein: the third portion of the switching member contacts the second electrical contact in a rest position to establish an electrical connection between the first and second electrical contacts, the third portion of the switching member is biased towards the rest position based on a deformation of the coupling feature or the first portion; and deflection of the first portion towards the PCB causes the third portion to break contact with the second electrical contact; in response to receiving the first signal, counting elapsed time; transmitting a first indicator signal to a visual indicator to provide an indication of the elapsed time; receiving a second signal indicating the cap of the medication container has been removed from the storage portion; in response to receiving the second signal, resetting the elapsed time; and transmitting a reset signal to the visual indicator to reset the indication of the elapsed time.

Another example medication container includes a storage portion enclosing a volume to store medication and having an opening providing access to the volume, and a cap configured to releasably couple to and seal the storage portion, the cap comprising: a printed circuit board ("PCB") having a set of electrical contacts comprising first and second electrical contacts; a mechanical switch physically coupled to the PCB at a first electrical contact formed on the PCB, the mechanical switch comprising a switching member, the switching member comprising a coupling feature physically coupling a first end of the switching member to the PCB at the first electrical contact and extending adjacent to the first side of the PCB from the coupling feature towards the second electrical contact, a second end of the switching member in contact with the second electrical contact when the switching member is in a rest position; a signal source coupled to the second electrical contact; a press plate positioned adjacent to the PCB and comprising at least one protrusion, wherein the protrusion is configured to extend through a corresponding hole in the PCB to deflect the switching member away from the PCB when the cap is coupled to the storage portion; wherein the switching member is biased towards the rest position; and deflection of the switching member away from the PCB causes the switching member to break contact with the second electrical contact.

These illustrative examples are mentioned not to limit or define the scope of this disclosure, but rather to provide examples to aid understanding thereof. Illustrative examples are discussed in the Detailed Description, which provides further description. Advantages offered by various examples may be further understood by examining this specification.

BRIEF DESCRIPTION OF THE DRAWINGS

The accompanying drawings, which are incorporated into and constitute a part of this specification, illustrate one or more certain examples and, together with the description of the example, serve to explain the principles and implementations of the certain examples.

FIGS. 3A-3B show an example switch for a medication container cap;

DETAILED DESCRIPTION

Figure 1A:
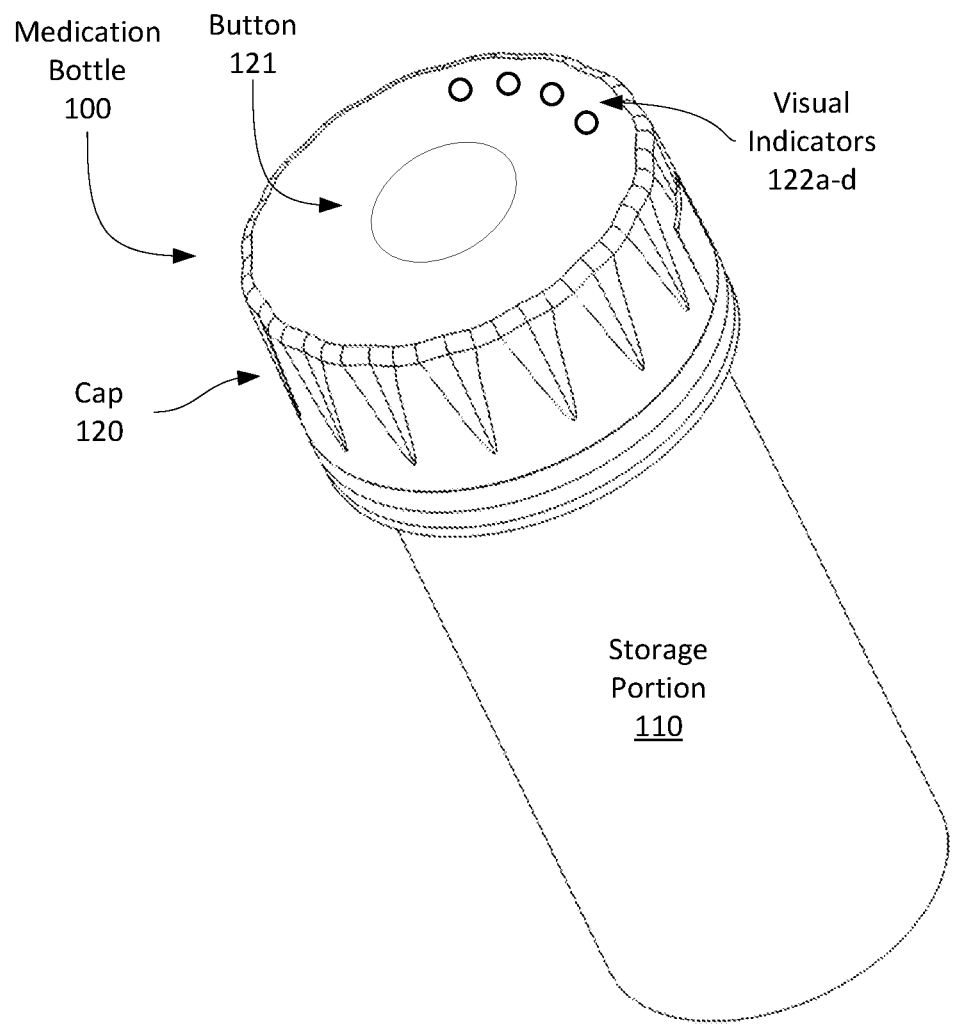
FIG. 1A shows an example medication container with a cap.

Examples are described herein in the context of switches for pill container caps. Those of ordinary skill in the art will realize that the following description is illustrative only and is not intended to be in any way limiting. Reference will now be made in detail to implementations of examples as illustrated in the accompanying drawings. The same reference indicators will be used throughout the drawings and the following description to refer to the same or like items.

In the interest of clarity, not all of the routine features of the examples described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another.

Medication, such as in the form of individual pills, capsules, tablets, etc. (collectively referred to as "tablets" in this disclosure), provided to consumers is often provided in bottles with re-sealable caps. Many of these have threads to allow them to be screwed into place, but others may be held in place by an interference fit and popped off (or re-sealed) by applying enough force. In other instances, cam-lock type mechanisms may be used to held the cap in place. In many cases, such containers are used to store medication that is to be taken on a regular dosing schedule, e.g., 1 pill every 12 hours. Thus, approximately every 12 hours, the person will remove the cap from the container, remove the appropriate dose of the medication, and then close the container using the cap. However, for these kinds of medication, people may forget if they have taken a particular dose of medication ("did I take a pill with breakfast?") or they may forget how long it has been since they took a dose ("did I take a pill at noon or at 2 pm?").

To help alleviate this problem, pill caps according to this disclosure include a timer and one or more switches in them to control the timing device. The switches are toggled when the cap is removed and then again when the cap is replaced on the container, thereby resetting the timer. The timer can then be used to provide an indication to the user, such as by lighting one or more lights on the pill cap, of how long it has been since the cap was removed from the medication container. In other instances, the timer data can be transmitted wirelessly to a another device with a display, such as a cellular phone, and the other device can show the user the time elapsed since the cap has been opened.

To enable this functionality, a small, circular printed circuit board ("PCB") has an electronic chip with a timer, along with a battery to run the chip. The PCB also has three switches attached to it that close when the pill cap is removed from the container. When the switches close, the chip receives an electrical signal to indicate that the pill cap has been removed, at which time the chip resets the timer. Later, when the pill cap is replaced on the container, the switches open and the chip lets the timer start running from 0. As the timer runs, it then starts illuminating small light-emitting diodes ("LEDs") on the cap. The number of LEDs that are illuminated indicates the number of hours or fractions of hours since the last time the cap was opened. In addition, the electronic chip logs each time the cap is removed and records a corresponding timestamp in the log.

The switches used in this example are each formed of a switch member constructed of a flexible conductive material. One end of the switch member is fixedly connected to an electrical contact on the PCB. The other end of the switch member extends up through the PCB and then angles towards a second electrical contact on the PCB; but this end is not fixedly coupled to the PCB. Thus it is the "free" end. Instead, the flexible switch member is biased so that the free end is pressed against the second electrical contact, but it is allowed to move up and down due to a force applied to the switch member. In this example, when the pill cap is screwed into place on the container, a press plate below the PCB is pressed up against the switch member, pushing it against the PCB. This in turn pushes the free end of the switch member away from the PCB, disconnecting it from the second electrical contact and opening the switch. However, when the pill cap is removed, the force on the switch member is removed and, because of the bias described above, the free end of the switch member moves back into contact with the second electrical contact, thereby closing the switch.

When the switch is closed (because the pill cap is open), the switch resets the timer. But when the pill cap is closed again, the switch is opened and the timer is allowed to run. Thus, the switch provides a mechanism to detect when the pill cap has been opened and closed.

In addition, because this example employs multiple switches, the timer can check to see if all switches are open or closed before taking any action. If less then all switches are open or closed, it may indicate that the pill cap has not been properly seated on the container or that the user is pressing one or more switches by hand, resulting in a false switch reading. Further, because the switch is designed to be pressed away from a contact when the medication container is closed, no electrical current flows through the switch, thereby saving power. In addition, because the free end of the switch is designed to move away unimpeded from the second electrical contact and because the switch does not otherwise include any internal moving parts, little to no mechanical wear occurs in the switching member itself or on the PCB and the second electrical contact. Thus, the example switch provides an efficient switching mechanism to detect the opening and closing on the medication container that provides reliable indications of such opening and closing events.

This illustrative example is given to introduce the reader to the general subject matter discussed herein and the disclosure is not limited to this example. The following sections describe various additional non-limiting examples and examples of switches for pill container caps.

Referring now to FIG. 1A, FIG. 1A shows an example medication container suitable for use with various switches and methods according to this disclosure. In this example, the medication container is a medication bottle 100 that includes a storage portion 110 and a cap 120. In this example, the cap 120 and the storage portion 110 are threaded to enable the cap 120 to be screwed onto the storage portion 110 to seal the storage portion 110 and to be screwed off of the storage portion 110 to enable access to medication stored in the medication bottle 100.

In this example, the cap 120 and the storage portion 110 can be releasably coupled via the threaded portions on each; however, other types of sealing techniques may be used. For example, the storage portion 110 may have an opening with a lip. The cap 120 may be pressed down and over the lip to engage with the lip, thereby sealing the storage portion 110. The cap 120 may later be pried or otherwise released from the lip to open the medication bottle. In some examples the cap may be coupled to the storage portion by a hinge and one or more tabs. By releasing the tabs, the cap may hinge away from the storage portion to unseal the storage portion and enable access to medication within the medication container. Re-sealing the container may then involve pressing the cap back against the tabs to re-engage the tabs to hold the cap in place. Still other releasable coupling techniques may be used to allow the cap 120 to seal the storage portion 110.

In this example, the cap 120 provides an air-tight seal of the storage portion 110 to prevent introduction of contaminants or fluids into the storage portion, which may degrade or otherwise damage the medication stored within the medication bottle 100. However, sealing the storage portion 110 does not require such a seal. Instead, sealing the storage portion 110 involves sufficiently closing the storage portion so as to prevent medication from falling out of the storage portion while the cap 120 is in place. Thus, a cap 120 may seal the storage portion without an air-tight seal or another seal to prevent in the ingress contaminants, liquids, or other foreign material.

In this example, the medication bottle 100 has a cylindrical shape, but such a shape is not required. For example, the storage portion 110 may have any suitable shape, such as rectangular, etc. Similarly the cap 120 may have any suitable shape, and the cap 120 and the storage portion 110 need not have the same shape so long as the cap 120 can be releasably coupled to the storage portion 110 to seal the storage portion 110 as discussed above.

As shown in FIG. 1A, the cap also includes a button 121 and several visual indicators 122a-d. The button 121 may be pressed to activate one or more visual indicators corresponding to an elapsed time since the cap 120 was last removed from the storage portion 110. The button 121 may be employed to only activate the visual indicators 122a-j when the user needs to see them, though the button 121 may be omitted in some examples and the visual indicators 122a-j may be activated when the corresponding amount of time has elapsed. When activated the visual indicators 122a-d may be used into indicate to the user that a predetermined amount of time has elapsed since the last time the cap 120 was removed from the storage portion 110, and thus may serve as a proxy for determining the amount of time since the person has taken a dose of medication.

In this example, the visual indicators 122a-d are LEDs, but any suitable visual indicator may be employed. For example, the visual indicator may be a liquid-crystal display showing the amount of elapsed time since the cap was last removed from the storage portion. Alternatively, there may be any number of multiple visual indicators. In the example shown in FIGS. 1A, four visual indicators 122a-d are provided, with each LED indicating a two-hour period has elapsed. Thus the first indicator 122a indicates two hours have elapsed since the last time the cap 120 was removed from the storage portion 110. The second indicator 122b indicates four hours have elapsed, and so forth. Still other configurations may be employed according to different examples.

It should be appreciated that in some examples, visual indicators 122a-d may be omitted. Instead, in some examples, the timer 180 may include a microprocessor (or microcontroller, FPGA, etc.) and the PCB may further include a wireless transmitter or transceiver 182. When the switches 140a-c change states, the microprocessor 180 may log the state changes to indicate when the cap 120 is removed from the storage portion 110. At a later time, when the user presses the button 121, the microprocessor 180 may then wirelessly transmit, e.g., via Bluetooth or Bluetooth low-energy ("BLE"), the logged information to another device, such as the user's smartphone, which may then display historical information about the bottle being opened and closed or it may display information indicating the last time the bottle was opened. Thus, while visual indicators 122a-d may be omitted from the cap 120, the cap 120 may still be able to provide information to the user to indicate the elapsed time since the last time the bottle was opened. Further, in some examples, rather than resetting the timer 180, the switches may simply indicate the bottle-opening and bottle-closing events, which the timer 180 (or microprocessor) can keep track of.

Figure 1B:
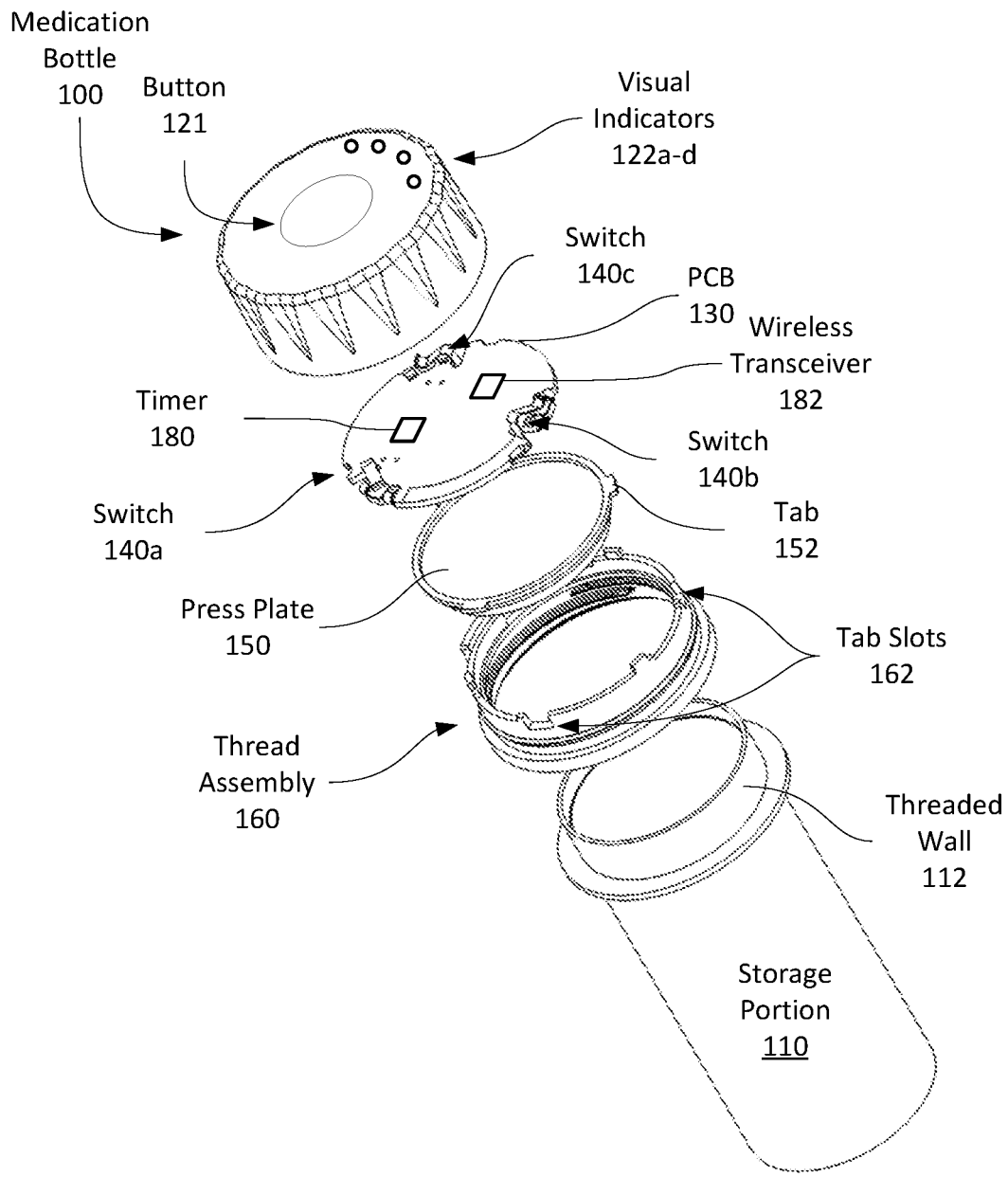
FIG. 1B shows an exploded view of the medication container of FIG. 1A.

Referring now to FIG. 1B, FIG. 1B shows an exploded view of the medication bottle 100 of FIG. 1A. As can be seen, the cap 120 includes several components in addition to the thread assembly 160 used to secure the cap 120 to the storage portion 110 as discussed above. In this example, the cap 120 includes a PCB 130 that has a timer 180 and three switches 140a-c coupled to it. A press plate 150 is positioned between the PCB 130 and the thread assembly 160, with tabs 152 on the press plate 150 engaging with tab slots 162 on the thread assembly 160 to maintain the relative positioning of the components. When assembled, the PCB 130 and press plate are positioned within the cap 120. The thread assembly 160 may be press-fit into the cap 120 or may screw into the cap 120 depending on the particular implementation. In some examples, the cap 120 may be disassembled, such as to replace a battery, while in other examples, the components may be permanently affixed to the cap 120, such as with an epoxy, other adhesive or by engagement of mechanical features.

When assembled, and as will be described in more detail below, the PCB 130 and the thread assembly 160 are fixedly seated within the cap 120, while the press plate 150 is free to move within the tab slots 162 with respect to both the PCB 130 and thread assembly 160. It should be appreciated that in some examples, the press plate 150 may be fixedly coupled to the threaded portion 160 and the PCB 130 may be allowed to move within one or more tab slots in the threaded portion 160 or the cap 120. Alternatively, in some examples, the PCB 130 may be positioned between the press plate 150 and the threaded portion 160. In such a configuration, the press plate 150 may be fixed in place while the PCB 130 may be free to move much as the press plate 150 is able to move in the example shown in FIG. 1B. Thus, the PCB 130 may be pressed against the press plate 150 when the cap 120 is coupled to the storage portion of the medication bottle 100.

When the cap 120 is decoupled from the storage portion 110, the press plate 150 is pressed away from the PCB by flexible members in the switches 140a-c, thereby closing each the switches 140a-c, which will be described in more detail below. However, when the cap 120 is screwed into place onto the storage portion 110, the threaded wall 112 presses against the press plate 150, which is in turn pressed against the switches 140a-c, opening each of them. Thus, by opening and closing the medication bottle 100, the switches 140a-c within the cap may be opened and closed.

Figure 1C:
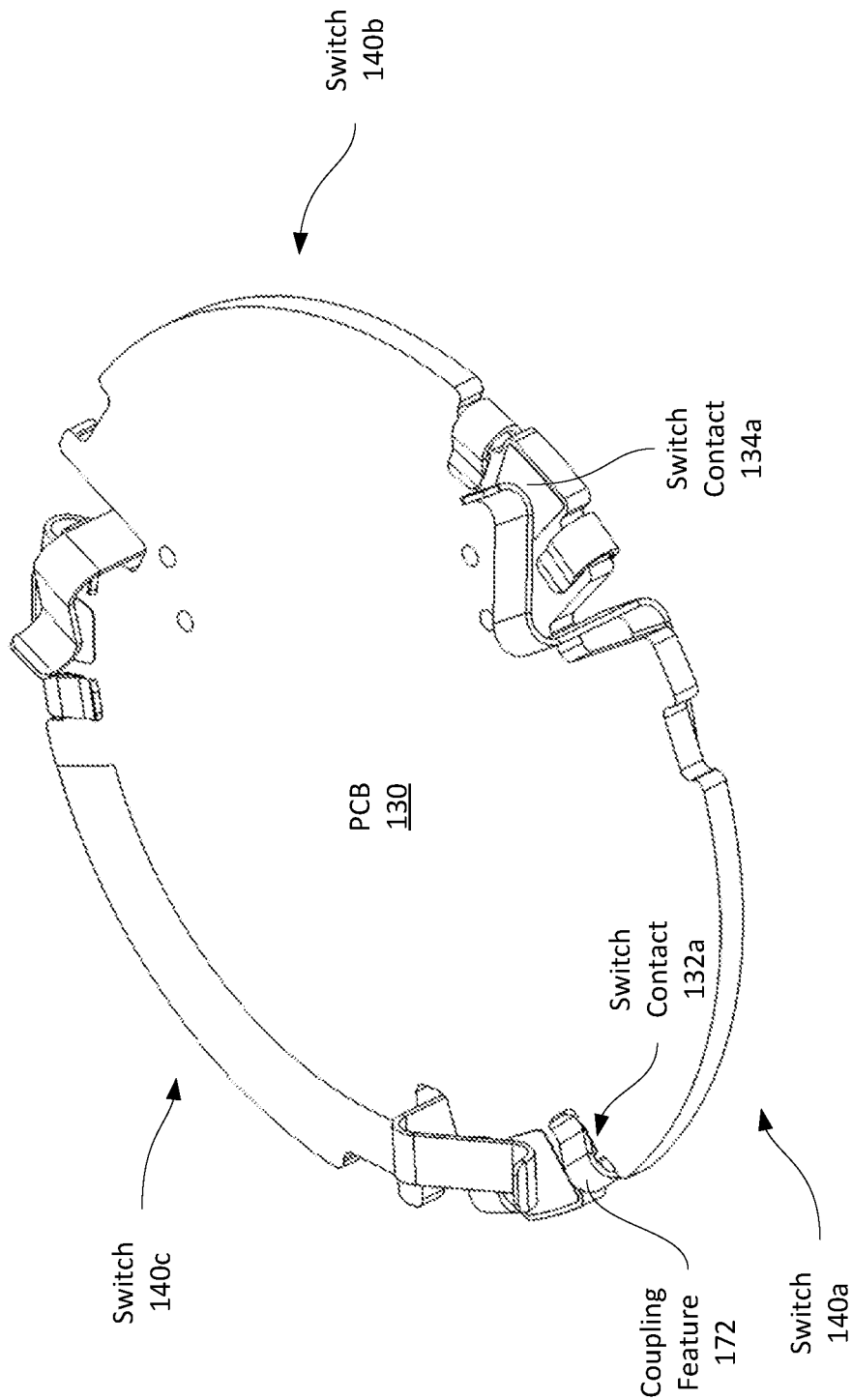
FIGS. 1C-1F show example switches for a medication container cap.
Figure 1D:
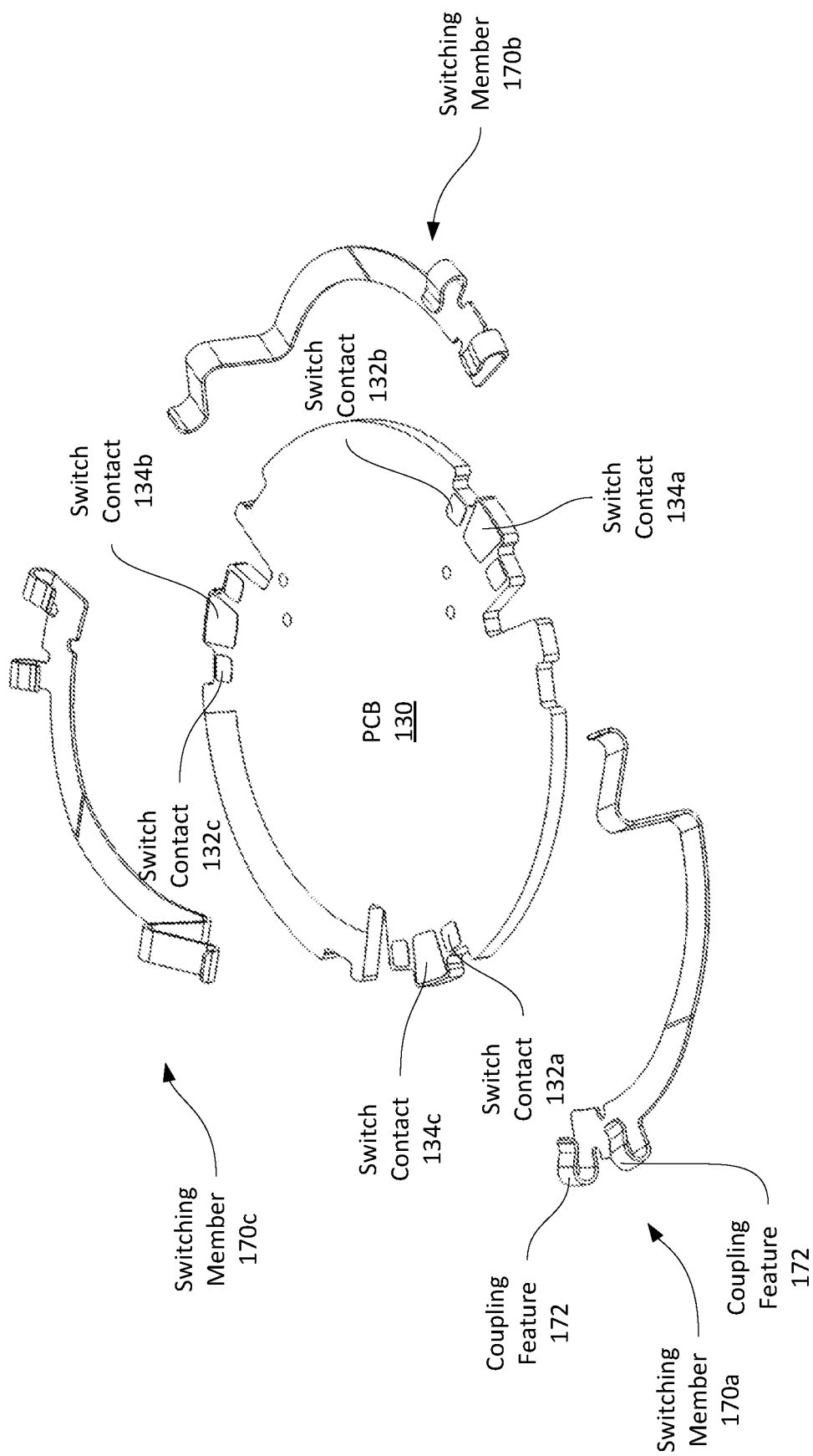

Referring now to FIGS. 1C and 1D, FIG. 1C shows the PCB 130 and switches 140a-c from FIG. 1B. FIG. 1C illustrates the "top" side of the PCB, which is the side of the PCB 130 that faces away from the storage portion 110 when the cap 120 is coupled to the storage portion 110, while the "bottom" side of the PCB faces the storage portion 110 when the cap 120 is engaged. Thus, the press plate 150 presses against the bottom portion of the PCB 130 when the cap 120 is coupled to the storage portion 110.

As can be seen, three switches 140a-c are provided in this example, though any suitable number of switches 140a-c may be employed. The switches 140a-c make and break connections between electrical contacts formed on the PCB 130. In this example, switch 140a makes or breaks contact between switch contact 132a (occluded by coupling feature 172 in FIG. 1C, but shown in FIG. 1D) and switch contact 134a. The corresponding switching member 170a (illustrated in FIG. 1D) is moved as described above with respect to FIG. 1B. Each switching member 170a-c is fixedly coupled at one end to the PCB 130 at a set of switch contacts 132a-c by a coupling feature 172, which in this example is a pair of clips; however any suitable coupling feature(s) may be used, including clips, clamps, solder, rivets, etc. The other end of the switching member 170a is free to move and contact another corresponding switch contact 134a-c. When the press plate 150 is pressed against the PCB 130 when the cap 120 is coupled to the storage portion 110, the switching members 170a-c deflect, causing the free end of each switching member 170a-c to be pushed away from a corresponding switch contact 134a-c, thereby opening the switch.

FIG. 1D shows an exploded view of the PCB 130 and switches 140a-c, which helps illustrate the components on the PCB 130 as well as the switching members 170a-c. As can be seen, three sets of electrical contacts are evenly positioned around the perimeter of the PCB 130. Each set of electrical contacts includes a pair of switch contacts 132a-c and one switch contact 134a-c. The pairs of switch contacts 132a-c each include two contact pads, but are electrically connected to each other on the PCB 130. For example, switch contact 132a has two contact pads that are electrically connected to each other. The two contact pads enable a high quality electrical connection between the switch contact 132a and coupling features 172 on switching member 170a that secure the switching member 170a to the PCB 130. Each switching member 170a-c is similarly coupled to the PCB at a corresponding switch contact 132a-c.

In addition, the coupling features 172 of each switching member 170a-c are separated from each other to allow the free end of an adjacent switching member 170a-c to settle onto the corresponding switch contact 134a-c. Thus, while switch contact 132a and switch contact 134c are physically adjacent to each other, they are parts of different switches 140a-c as can be seen in FIG. 1C. It should be appreciated that this arrangement of contacts is only one way to arrange the electrical contacts and switching members. Rather than using the split coupling features 172, in some examples, the switching members may have a single coupling feature 172, or closely spaced coupling features, corresponding to similarly spaced electrical contacts 132a-c, while the switch contact 134a-c is not positioned between such contacts. This would eliminate physical overlap of the switching members 170a-c. and may be desirable in some situations, such as to prevent inadvertent electrical connections being made between adjacent switches 140a-c. Further, while three switches 140a-c are illustrated in FIGS. 1C and 1D, Similar arrangements of switches may be made with any suitable number of switch members and corresponding switch contacts.

Figure 1E:
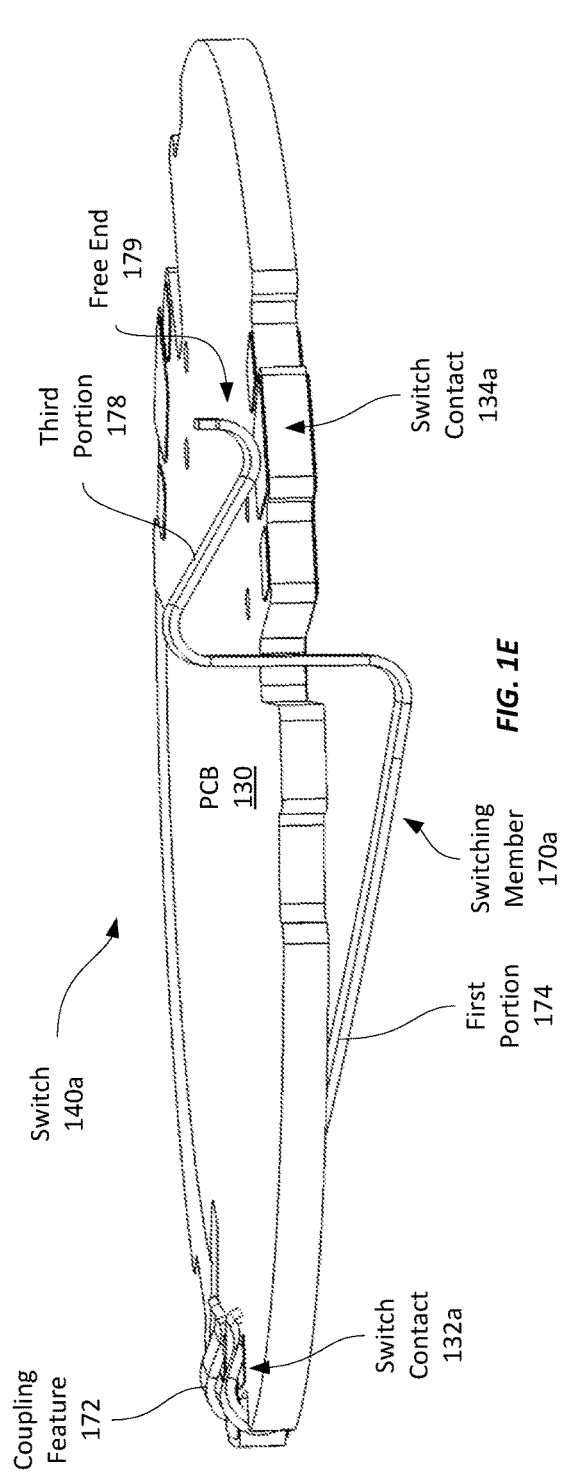
Figure 1F:
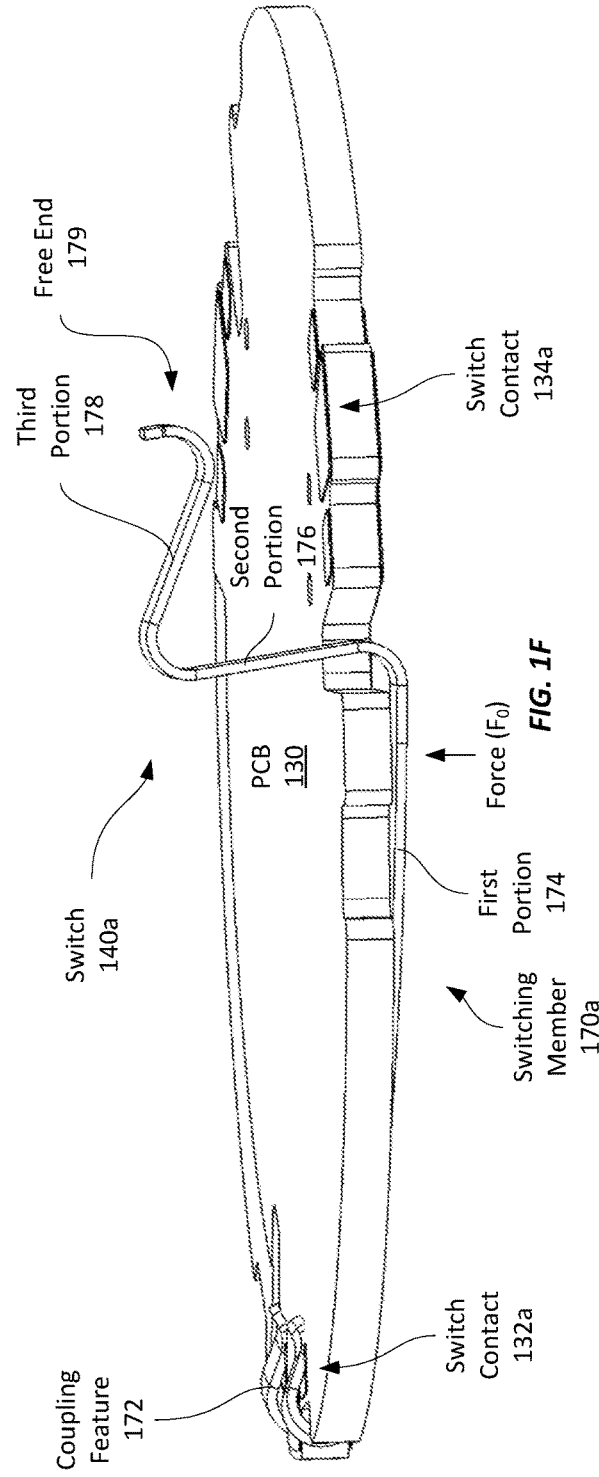

Referring now to FIGS. 1E and 1F, these figures illustrate switch 140a in the closed and open positions, respectively. In FIG. 1E, switch 140a is depicted as being closed. Switching member 170a is physically coupled to the PCB 130 and switch contacts 132a by coupling features 172. Thus, the switching member 170a is also electrically coupled to switch contacts 132a. In addition, the free end 179 of the switching member 170a is resting in contact with switch contact 134a.

The free end 179 of the switching member is held in place by a physical bias applied to the switching member 170a, which is in a rest position. This physical bias is typically the result of stored elastic energy in switching member 170a. The rest position occurs when the switching member 170a is allowed to return to a state with as little bias or stored elastic energy as allowed by the configuration, e.g., by removing a force applied by another component such as by the press-plate 150. In this example, the first portion 174 of the switching member 170a extends from the coupling features, while a second portion 176 extends through an opening in the PCB 130, and a third portion 178 angles back towards the PCB at the free end 179. The shape of the coupling feature 172 and the first portion 174 create an angle that biases the switching member away from the bottom surface of the PCB 130; however, because the third portion 178 is positioned adjacent to the top surface of the PCB 130, it is also biased in the same direction, but is obstructed by the top surface of the PCB 130. This biasing force holds the free end 179 of the switching member against the PCB 130 and the switch contact 134, Because the switching member 170 is constructed of a conductive material, such as steel or another metal, the switching member electrically connects switch contact 132a and switch contact 132b, thereby closing the switch.

In FIG. 1F, the same switch 140a has been opened. While not depicted in this figure, when the press plate 150 is pressed against the PCB 130 such as in response to the cap 120 being screwed onto the storage portion 110, it also presses against the first portion 174 of the switching member 170a, which deflects the switching member 170a towards the PCB. This causes the free end 179 of the switching member 170a to lift away from switch contact 134a, breaking the electrical connection between the switching member 170a and switch contact 134a, thereby opening the switch 140. It should be appreciated that by deflecting the switching member 170a as shown in FIG. 1F, the total biasing force exerted by the deformation of the coupling features 172 and the first portion 174 of the switching member 170a is increased. Thus, when the cap 120 is removed from the storage portion, the biasing force pushes the press plate 150 away from the PCB 130, allowing the free end 179 of the switching member to return to a rest position in contact with the switch contact 134a, thereby closing the switch as shown in FIG. 1E. When the switch is closed, the switching member 170a provides an electrical connection between switch contact 132a and switch contact 134a. As will be discussed in more detail below with respect to FIGS. 5-7, closing the switch may provide an electrical signal to the timer 180, such as a discrete timing circuit or to a processor, such as a microcontroller, that implements timing functionality.

Figure 2A:
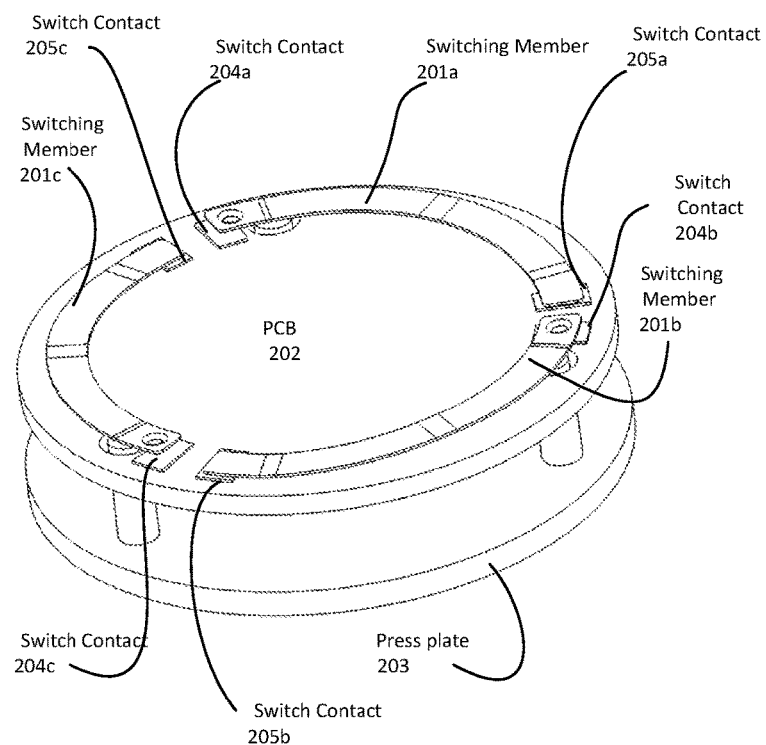
FIGS. 2A-2D show an example switch for a medication container cap.
Figure 2B:
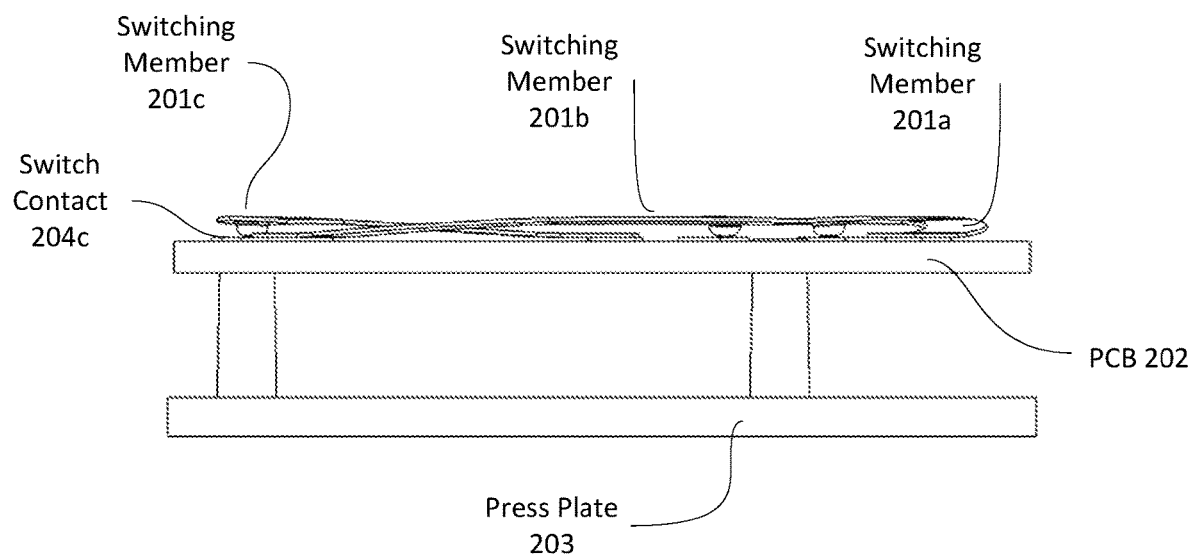
Figure 2C:
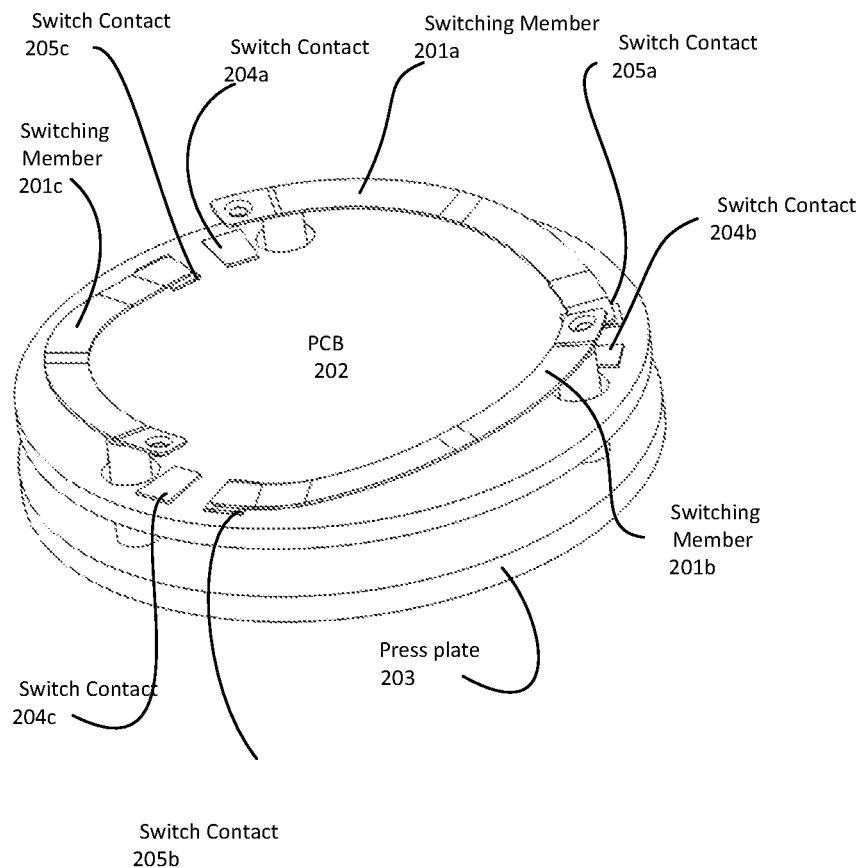
Figure 2D:
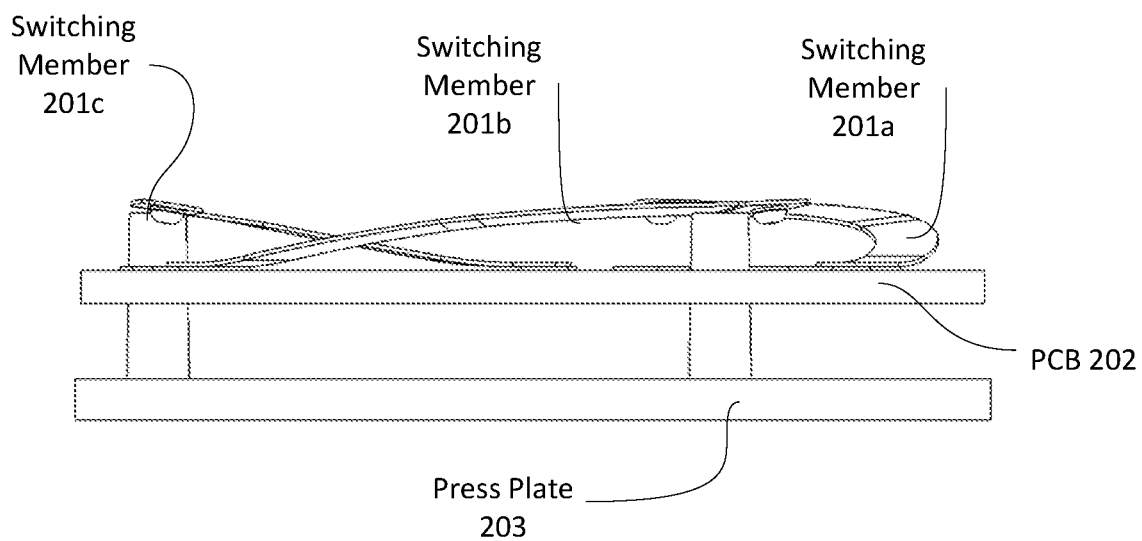

Referring now to FIGS. 2A-2D, FIG. 2A shows a different configuration that can operate in a manner similar to the configuration described in FIGS. 1A through 1F. In FIG. 2A, switching member 201a is attached to the top of the PCB 202 and fixed to switch contact 205a. Press plate 203 has protrusions that extend through PCB 202. FIG. 2A shows the state where the cap is removed from the bottle and switching member 201a creates an electrical connection between switch contacts 204a and 205a. FIG. 2B is a side view of FIG. 2A. In FIG. 2C, press plate 203 is pressed upwards and the protrusion of press plate 203 lifts switching member 201a away from contact 204a, thus breaking the electrical connection. As can be seen, in this example the protrusion passes through a void or cutout in the PCB. FIG. 2D is a side view of FIG. 2C.

Referring now to FIGS. 3A and 3B, these figures show another example of a switch employing a switching member 370 according to this disclosure. The switch 300 may be used as an alternative to the switches 140a-c shown in FIGS. 1A-1F according to some examples.

As illustrated in FIG. 3A, the switching member 370 is coupled at a coupling location 310 on a PCB 330, which may be PCB 130 in some examples, and one end of the switching member 370 is fixedly coupled to a switch contact 312 on the PCB 330, such as switch contact 132a. The switching member 370 defines a bulge 373 that extends away from the PCB 330 and then extends back towards the PCB 330. The other end of the switching member 370 is the free end 372 of the switching member and defines a curved feature 374. In the rest position illustrated in FIG. 3A, the curved feature 374 is in contact with switch contact 320, which establishes an electrical connection between switch contacts 312 and 320. The curved feature 374 also provides a mechanical spacer for the switching member 370 to help prevent other parts of the switching member 370 from contacting the PCB when a force is applied to the switching member 370.

The shape of the switching member 370 enables the switching member to deform when a force is applied to the switching member 370, causing the curved feature 374 to slide to the other switch contact 322. When the force is removed, the switching member returns to its rest shape and the curved feature 374 slides back to its rest position in contact with switch contact 320. FIG. 3B illustrates the switching member 370 while a force, $F_0$, is applied to it. The force, $F_0$, will be referred to as a "downward" force in this example, though the arrangement of the switching member and direction of the force can be in any suitable orientation.

When the switching member 370 is deformed, the free end 379 is forced to translate along the PCB 330. Thus, changing the electrical connection from switch contact 320 to switch contact 322. In some examples, switch contact 322 creates an open circuit, preventing electrical current to flow through the switching member 370, while switch contact 320 creates a closed circuit, allowing electrical current to flow through the switching member 370. Such a configuration may enable reduced power consumption when the switch 300 is used in an arrangement similar to the examples shown in FIGS. 1A-1F. When the cap 120 is coupled to the storage portion 110, a force may be applied to the switching member 370, resulting in the configuration shown in FIG. 3B. In such a case, no current would flow through the switching member 370, preventing power consumption. Instead, when the cap is removed from the storage portion, the switching member 370 returns to its rest position and closes the electrical connection between switch contacts 312 and 320, causing electrical current to flow. In some cases, switch contact 322 may be entirely omitted and instead may be a non-conductive material, such as a plastic or silicone. Thus, when a force is applied, the curved feature 374 slides off of switch contact 320 but does not encounter a further electrical contact, thereby opening the switch 300.

The switching member 370 shown in FIGS. 3A and 3B may be used instead of the switching members 170a-c shown in FIGS. 1A-1F. For example, the fixed end 371 of the switching member 370 may be fixedly coupled to electrical contact 132a, while the free end 372 may be allowed to rest on a non-conductive portion of the PCB, out of contact electrical contact 134a. The non-conductive region (or a second electrical contact) may be positioned adjacent to electrical contact 134a such that when a downward force is applied to the switching member, the free end slides onto the electrical contact 134a, thereby closing the switch. Further, multiple switches 300 using switching member 370 may be provided on the PCB 130, such as shown in FIGS. 1A-1F. Thus, the switch 300 may be used as an alternative to the switches 140a-c shown in FIGS. 1A-1F.

Figure 4:
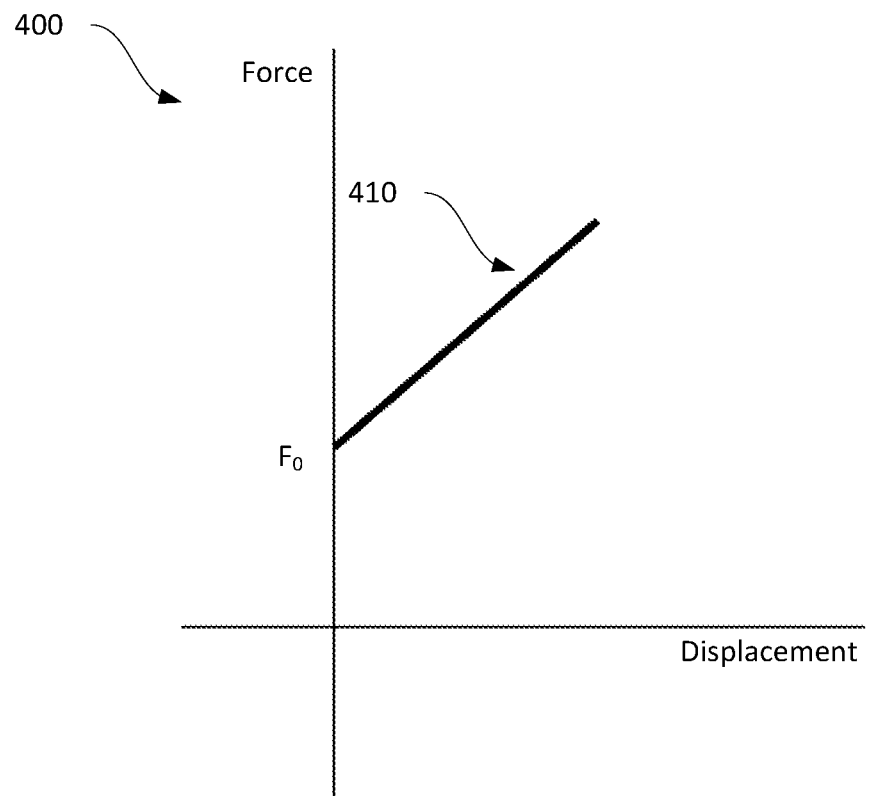
FIGS. 4 and 5 illustrate a graph of applied force to a switch in comparison to the displacement of the switch.
Figure 5:
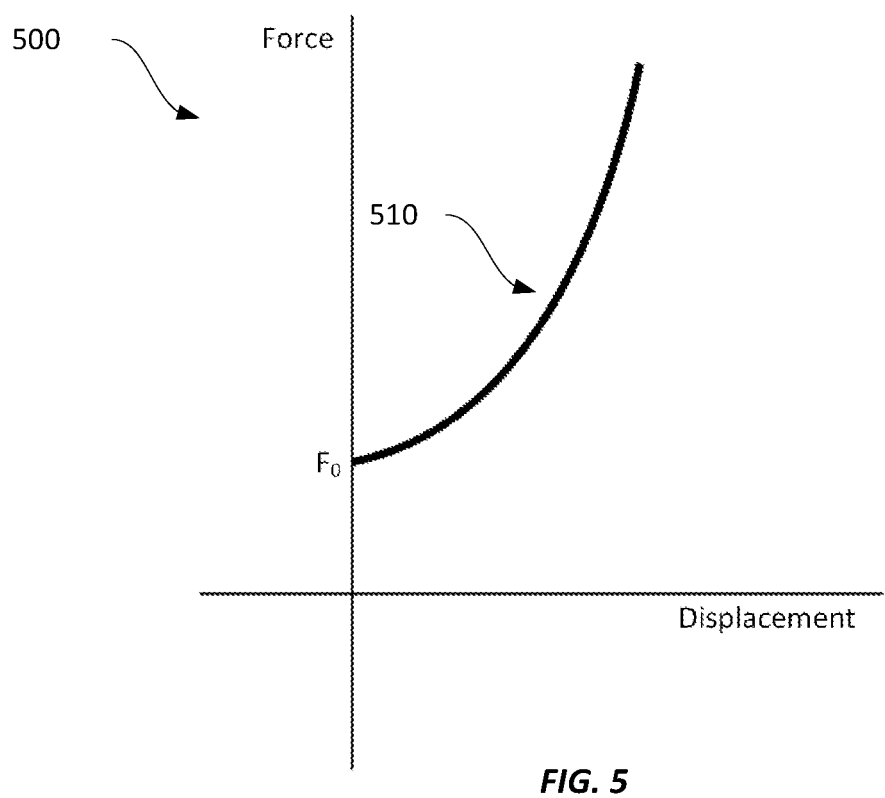
Figure 7:
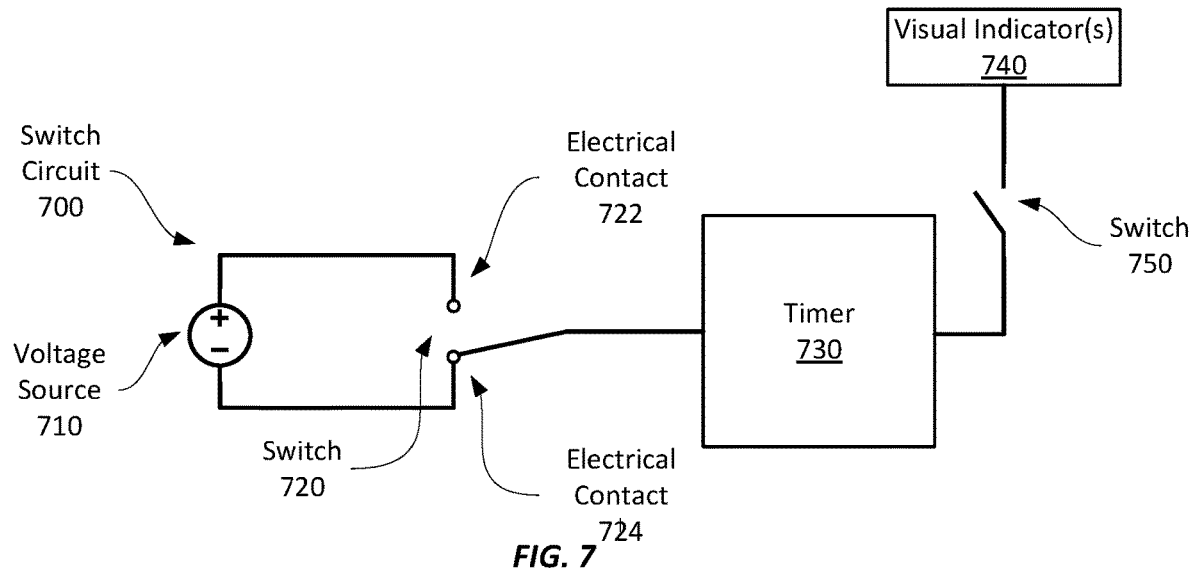

Referring now to FIGS. 4 and 5, these figures illustrate a difference in the way force results in displacement of the switching members 170, 201a-c, shown in FIGS. 1A-1F and FIGS. 2A-2D versus switching member 370 shown in FIGS. 3A-3B. FIG. 4 illustrates the relationship between force and displacement for the switching members 170a shown in FIGS. 1A-1F or 201a-c in FIGS. 2A-2D. As a force is applied to the switching member 170a, the free end is pushed away from the PCB and the distance travelled increases substantially linearly as the force increases. In contrast, the switching member 370 shown in FIGS. 3A-3B requires a nonlinearly increasing force to increase the amount of displacement. A linearly increasing force-deflection relationship may be desirable to reduce the effort required from the user and to reduce the amount of force applied to the switching mechanism to change states. This may reduce wear as the switch is used over time and may make the medication container easier to use. However, the switching member 370 in FIGS. 3A-3B also enables the use of a single-pole double-throw switching configuration, an example of which is illustrated in FIG. 7 below. Over short distances, the relationship shown in FIG. 5 may approximate a linear relationship, however, depending on the configuration of such a switch 300, substantially more force may be required to change the state of the switch 300 in FIGS. 3A-3B as compared to the example shown in FIGS. 1A-1F or 2A-2D. However, each switch 140a-c, 201a-c. and 300 may be employed according to different examples.

Figure 6:
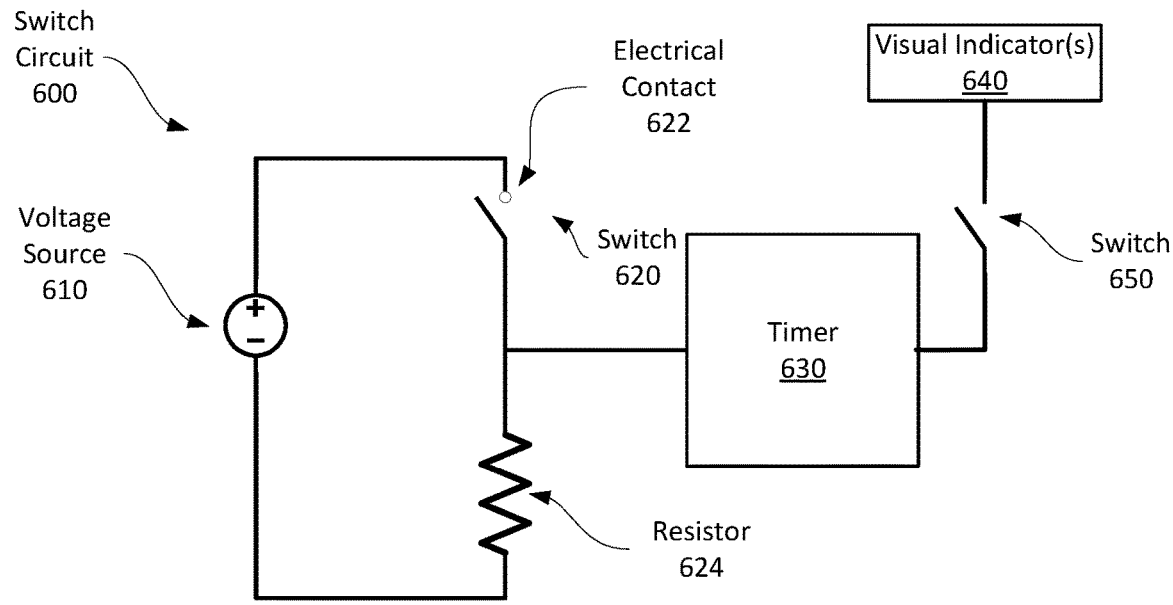
FIGS. 6-9 show circuit diagrams for example switches for medication container caps.

Referring now to FIG. 6, FIG. 6 shows an electrical diagram illustrating the use of switches according to this disclosure. As discussed above, a medication container may include a timer that is reset when the cap 120 is removed from the storage portion 110. In the example, shown in FIG. 6, timer 630 has an input that is connected to the switch circuit 600 and one or more outputs connected to corresponding visual indicator(s) 640. In addition a second switch 650 is electrically coupled between the timer and the visual indicators 640. When the switch 620 is closed, voltage from the voltage source 610, e.g., +3 volts, is connected to the timer's input, resetting the timer. When the switch is opened 620, the timing circuit has an open circuit and voltage is disconnected and the timer 630 runs. And while the signal source is a voltage source 610 in this example, a current source may be used in some examples.

As discussed above, switches may be arranged to create an open circuit when open and close a circuit when closed. For example, the switches in FIGS. 1A-1F are open when the cap 120 is coupled to the storage portion 110, when the free ends 179 of the switching members are lifted out of contact with the switch contacts 134a-c. Similarly, the switch 300 shown in FIGS. 3A-3B can be used to create an open circuit by using a non-conductive switch contact 322 (or 320, depending on the configuration of the switch) or by using a conductive contact that lacks a further connection to any circuitry. When the switches are closed, e.g., when the switching members return to a rest state, an electrical connection is established, which can be used to reset the timer.

While the timer 630 is shown as a discrete timer component, in some examples, timer 630 may be a processor that implements timing functionality. For example, the timing functionality may be implemented in software or hardware by the processor. Further, it should be appreciated that the discussion of the timer 630 indicates that the timer runs when the switch 620 is open, and is reset when the switch 620 is closed; however, the opposite configuration could be used instead in some examples. Thus, in some examples, when the cap 120 is coupled to the storage portion 110, the switch 620 may be closed, and opened when the cap 120 is removed from the storage portion 110. However, in examples employing the switches 140a-c shown in FIGS. 1A-1F, the timer 630 is configured to run when the switch 620 is open and to reset when the switch 620 is closed. It should further be appreciated that while this (and other) examples discuss resetting the timer 630, the timer 630 may continue to run without being reset, but instead, the timer 630 or an associated microprocessor (e.g., the microprocessor executing the timer functionality) instead logs each time the switch changes state and the corresponding state. Such logging may then provide a history of when the medication container was opened and closed. Further, such information may be transmitted to another device using a wireless transmitter or transceiver 182, such as in response to the button 121 being pressed.

To help reduce power consumption, the second switch 650 has been included in this example to electrically decouple the timer's output from the visual indicator(s) 640. As discussed above, as the timer 630 runs, one or more time thresholds may be reached, causing the timer 630 to output one or more signals to control the visual indicator(s) 640. Switch 650 may be used to only allow the visual indicators 640 to be activated when the switch is closed, e.g., by pressing the button 121 on the cap 120. When the button 121 is released, the switch 650 is opened and the timer 630 is electrically disconnected from the visual indicators 640, deactivating them. By using such a switch 650, the visual indicators 640 may only be activated when the user checks to see whether it is time to take another dose of medication or not. It should be appreciated that switch 650 may be any suitable mechanical switch or electronic switch.

Referring to FIG. 7, FIG. 7 shows an alternate switch circuit 700 that employs a switch 720 that toggles between two closed states, rather an open state and a closed state. Depending on the state of the switch, either a positive or negative voltage is applied to the timer 730. Application of one signal resets the timer 730, while application of the other signal causes the timer 730 to run (and output signals to one or more visual indicators 740 via switch 750, which operates similarly to switch 550 above). In some examples, the switch illustrated in FIGS. 2A-2B may be employed in switch 720. For example, electrical contacts 220, 222 may provide the electrical contacts 722, 724 shown in FIG. 6, thereby providing electrical couplings to different voltages provided by the voltage source 710. Toggling the switching member between the electrical contacts 722, 724 creates different electrical connections between the voltage source 710 and the timer 730, thereby causing the timer 730 to be reset or to run, depending on the state of the switch. Whether the timer 730 is reset based on application of a positive or negative voltage through the switch may be determined based on the particular design requirements of various examples according to this disclosure.

A distinction between this example switch circuit 700 and the example shown in FIG. 6, is that if switch 520 is in the closed state, a current would flow through switch 520 and resistor 524 as well as through the internal circuitry in timer 530. Therefore, there will be some level of current consumption during the time when the switch 520 is on. In contrast, in FIG. 6, the only current consumed would be in timer 730. Timers 530 and 730 can be configured to have a very low current draw. Therefore, the circuit in FIG. 6 may consume less current over time than the circuit in FIG. 5.

It should be appreciated that the switch circuits shown in FIGS. 6 and 7 show a single switch, however, it should be appreciated that the switches 620, 720 may represent multiple switches, of which some or all must be closed to reset the timer 630, 730 or allow the timer 630, 730 to run. For example, the configuration shown in FIGS. 1A-1F requires all three switches 140a-c to be closed to reset the timer 730 when the cap 120 is removed from the storage portion 110. This could then be represented in FIG. 6 by modifying the switch circuit 600 to use three switches 620 in series with each other, all of which must be closed to connect the timer 630 to the voltage source 610. Alternatively, fewer than all the switches may need to be closed in some examples. In such examples, combinations of switches in series and in parallel may be used to create the desired switching requirement for the timer 630. For example, to implement a scheme where only two of the three switches 140a-c in FIGS. 1A-1F must be closed to reset the timer, three parallel sets of switches in series may be used: a first set with switches 140a-b in series, a second set with switches 140b-c in series, and a third set with switches 140a,c in series. Thus, if any one set of switches is entirely closed, the timer would be reset. Still any other suitable switch configuration may be employed.

Figure 8:
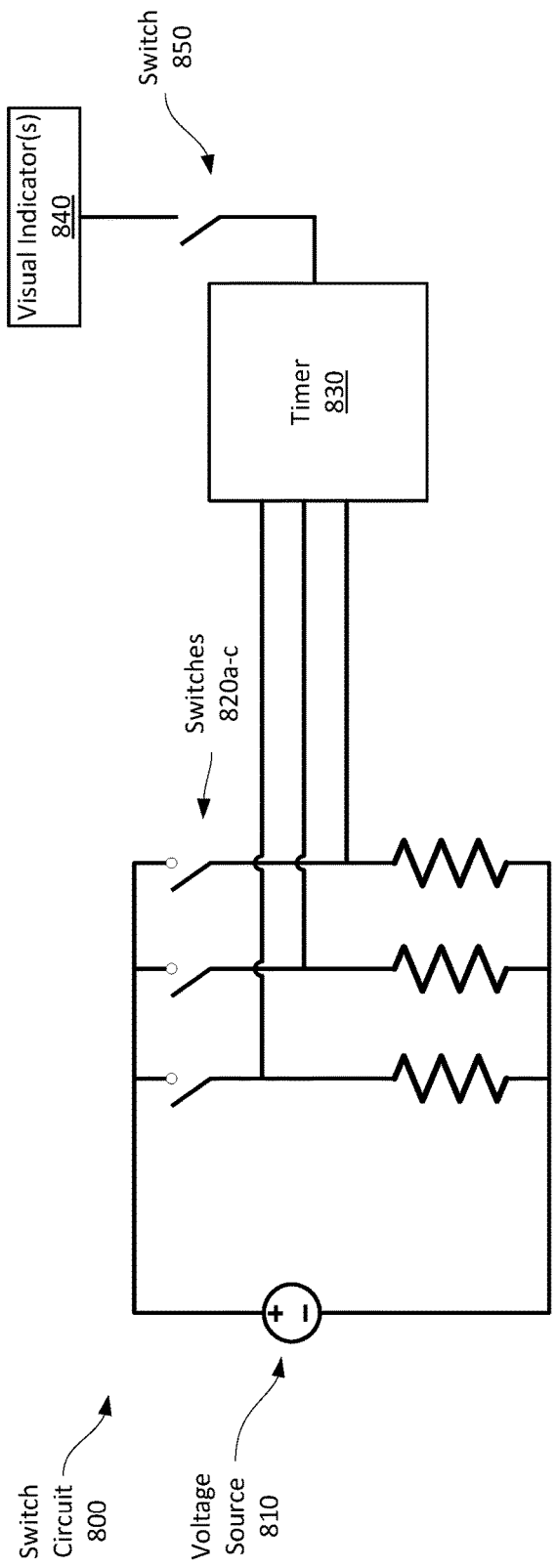

Referring now to FIG. 8, FIG. 8 shows an example where the timer 830 is configured to determine how many switches have been closed and reset (or run) based on the number of switches opened or closed. In the switch circuit 800 shown in FIG. 8, three switches 820a-c are arranged in parallel and each supplies an input to the timer 830. The timer may then include logic or software to receive the input signals and determine whether to reset the timer or allow it to run and output signals to illuminate one or more visual indicators 840. And similar to the examples discussed above with respect to FIGS. 6 and 7, switch 850 can be used to activate or deactivate the visual indicators 840, e.g., based on a user pressing a button 121 on the cap 120. Still further example configurations may be used in different implementations. Still further example configurations may be used in different implementations.

Figure 9:
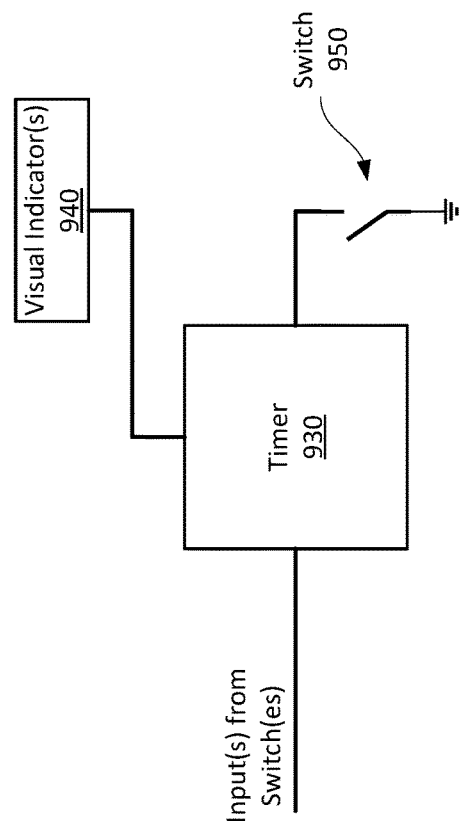

Referring now to FIG. 9, FIG. 9 shows an alternate arrangement for a switch 950 to activate or deactivate visual indicators 940. While the examples shown in FIGS. 6-8 electrically decouple the respective timers 630-830 from the corresponding visual indicators 640-840, in this example, the switch 950 is used to send a signal to the timer 930 regarding whether to activate the one or more visual indicators 940 or not. In this example, when the switch 950 is closed, e.g., when the button 121 is pushed, it pulls an input on the timer 930 to ground, thereby causing the timer to output signals to the visual indicators 940, illuminating one or more of them. When the switch 950 is opened, e.g., by releasing the button, the timer 930 stops transmitting the signals to the visual indicators 940, thereby deactivating them. While this example pulls the input on the timer 930 to ground, any suitable signal source may be used to provide the signal to the timer 930.

Figure 10:
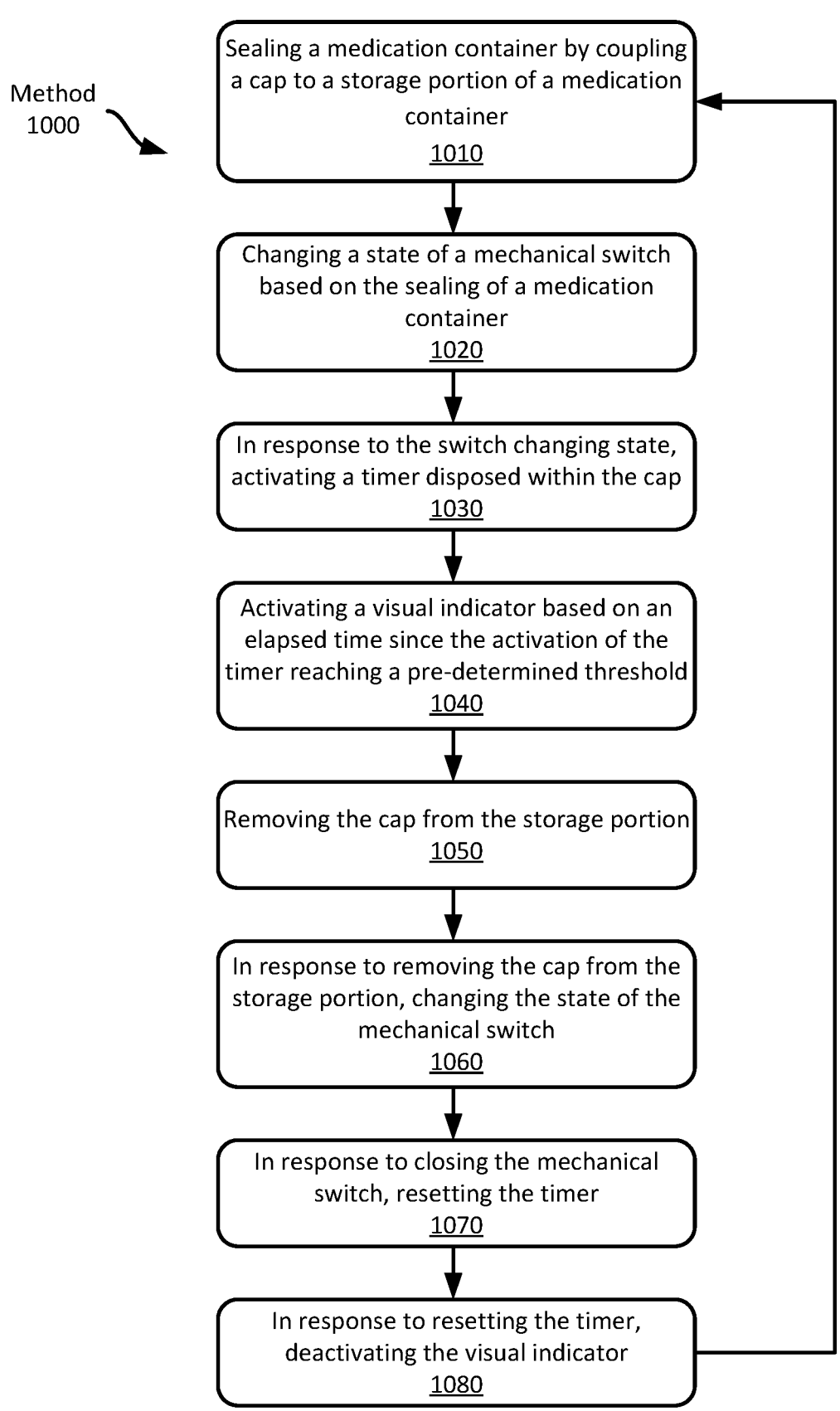
FIGS. 10 and 11 show example methods for switches for medication container caps.

Referring now to FIG. 10, FIG. 10 shows a method 1000 of using switches for medication container caps. The method 1000 will be discussed with respect to the medication container 100 and switches 140a-c shown in FIGS. 1A-1F; however any suitable medication container 100 and switches according to this disclosure may be employed, such as the switches 201a-c, 300, 720, 720, 820a-c shown in FIGS. 2A-2D, 3A-3B, and 6-8.

At block 1010, a user seals a medication container 100 by coupling a cap 120 to a storage portion 110 of the medication container 100. For example, the user may screw the cap 120 onto a threaded portion of the storage portion 110 to seal the medication container. It should be appreciated that "sealing" may not create an air-tight or similar seal, but may instead simply close the medication container 100 sufficiently to prevent medication within the storage portion 110 from falling out of the medication container 100.

At block 1020, as the cap 120 is coupled to the storage portion 110, one or more mechanical switches 140a-c within the cap may change state based on the sealing of a medication container 110. In this example, coupling the cap 120 to the storage portion 110 causes the switching members 170a-c to deflect towards the PCB 130 within the cap 120, thereby lifting the free ends 179 of the switching members 170a-c away from the corresponding switch contact 134a-c, which opens the switches. This changes the state of the switches 170a-c from a closed state to an open state. In some examples, however, the switch(es) may change from an open state to a closed state, or the switch(es) may change a connection from one electrical contact to another electrical contact. Examples of such switches are shown in FIGS. 2A-2B and 6.

At block 1030, in response to the switch(es) changing state, the timer 180 in the cap 120 is activated and begins to count elapsed time. For example, an input to a discrete timer circuit or chip may be changed to a "run" state based on the switch(es) changing state. In some examples, the timer 180 may be implemented by a processor and the processor may receive a signal from the switch(es) and may begin running a timer based on the signal. In some examples, any change in state of the timer's input may reset the timer 180 and cause it to immediately begin running. Thus, closing the medication container 100 resets the timer 180 and causes it to begin running.

At block 1040, the timer 180 activates one or more visual indicators 122a-d based on an elapsed time since the activation of the timer reaching a pre-determined threshold. For example, the timer 180 may output a signal upon reaching a predetermined elapsed time (e.g., 6 hours). The output signal may illuminate a visual indicator, such as one or more LEDs 122a-d. In some examples, the visual indicators 122a-d may only be activated (or may change state, e.g., in the case of an LCD display) in response to a user input, such as by pressing the button 121 on the cap. This may reduce the amount of energy consumption by the cap 120 when the user is not actively viewing the visual indicators 122a-d.

At block 1050, a user removes the cap 120 from the storage portion 110, such as by unscrewing the cap 120 from the threaded portion of the storage portion 110 or by popping the cap 120 off of a lip or breaking another mechanical seal.

At block 1060, in response to removing the cap 120 from the storage portion 110, the state of the mechanical switch(es) is changed again. In this example, removing the cap 120 allows the switches 140a-c to return to a rest position, in contact with switch contacts 134a-c, changing the state of the respective switch 140a-c from open to closed. In some examples, such as the examples shown in FIG. 2A-2B or 7, one or more switching members 270 may transition from one switch contact to another, thereby changing the state of the corresponding switch 200.

At block 1070, in response to closing the mechanical switch 140a-c, 200, the timer is reset. In this example, the timer 180 is maintained in the reset state while the switches 140*a-c*, 200 are in this state. However, in some examples, the timer 180 may immediately begin running again after being reset. Such an embodiment may be useful in the even the user fails to close the cap 120 entirely or forgets to put the cap 120 back on the storage portion 110. In such a case, the timer 180 will still run, indicating when the user last opened the medication container.

At block 1080, in response to resetting the timer, the visual indicators 122*a-d* are deactivated.

After block 1080, the method 1000 returns to block 1010 when the medication container 100 is resealed.

Figure 11:
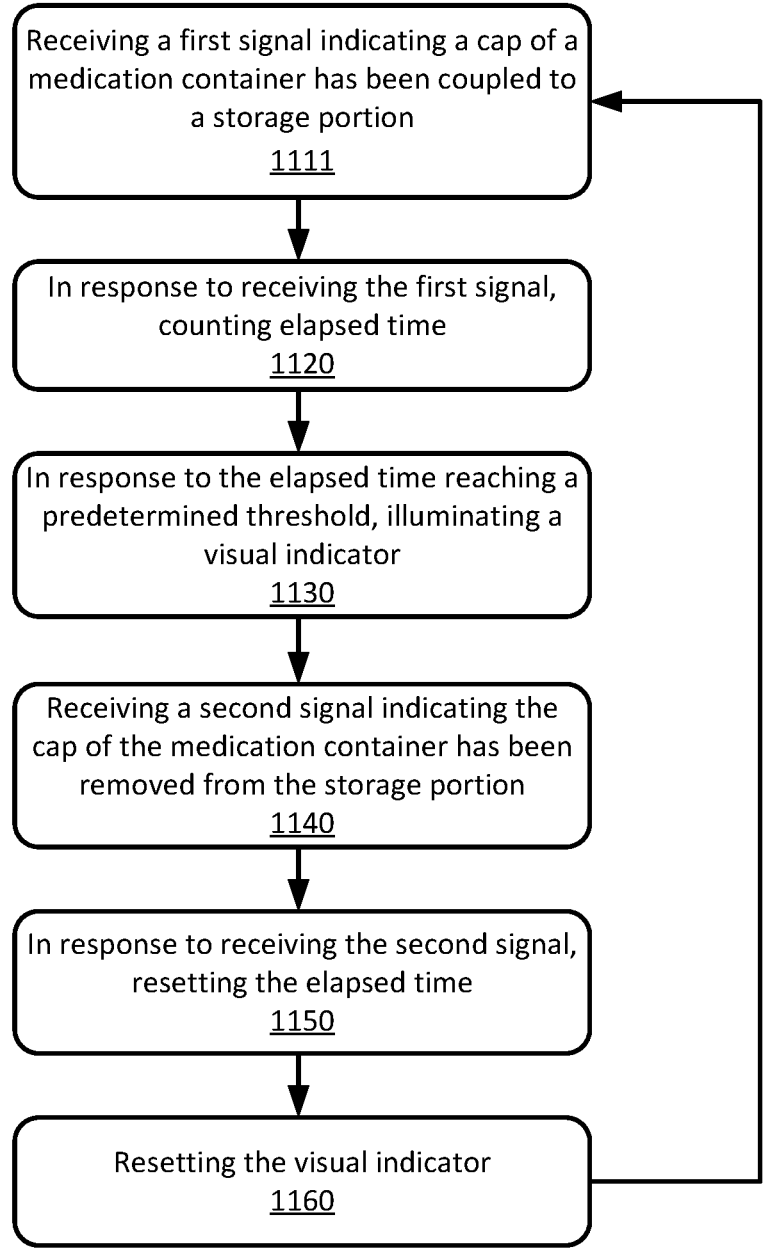

Referring now to FIG. 11, FIG. 11 shows an example method 1100 of using switches for medication containers. The method 1100 will be discussed with respect to the medication container 100 and switches 140*a-c* shown in FIGS. 1A-1F and 5; however any suitable medication container 100 and switches according to this disclosure may be employed, such as the switches shown in FIGS. 2A-2B, 3A-3B, and 6-8.

At block 1110, the timer 630 receives a first signal indicating a cap of a medication container has been coupled to a storage portion. In this example, the timer 630 receives a voltage indicating that the switch 620 (representing switches 140*a-c*) has been opened.

At block 1120, in response to receiving the first signal, the timer 530 begins counting elapsed time. In some examples, the timer 630 may also reset and begin counting elapsed time in response to receiving the first signal.

At block 1130, the timer 630, in response to the elapsed time reaching a predetermined threshold, activates a visual indicator 122*a*. In this example, the timer 630 outputs a signal after two hours has passed; however, any suitable predetermined threshold may be employed. Further, in some examples, multiple thresholds may be used to illuminate multiple different visual indicators. For example, after successive two-hour intervals, the timer 630 may activate additional visual indicators 122*b-d*. In some other examples, the visual indicator(s) may be able to output numbers indicating the amount of elapsed time, such as in examples where the visual indicator is a display, such as an LCD display or a display screen. Further, as discussed above, in some examples, the visual indicators 122*a-d* may only be activated (or may change state, e.g., in the case of an LCD display) in response to a user input, such as by pressing the button 121 on the cap. This may reduce the amount of energy consumption by the cap 120 when the user is not actively viewing the visual indicators 122*a-d*.

At block 1140, the timer 630 receives a second signal indicating the cap 120 of the medication container 100 has been removed from the storage portion 110. In this example, the second signal is received in response to the switch 620 (representing switches 140*a-c*) closing. However, in other examples, the second signal may be in response to the switch (or switches) changing states, such as the examples shown in FIG. 2A-2B, 3A-3B, or 7-8.

At block 1150, in response to receiving the second signal, the timer resets the elapsed time. In some examples, the timer 630 may reset the elapsed time and then begin counting elapsed time again; however in this example, the timer remains reset until the first signal is received again.

At block 1160, the timer 630 deactivates the visual indicators 122*a-d*. However, in some examples, the timer 630 may reset the visual indicator, such as by displaying 0:00 using an LCD or LED display. The method 1100 then returns to block 1110.

While some examples of methods and systems herein are described in terms of software executing on various machines, the methods and systems may also be implemented as specifically-configured hardware, such as field-programmable gate array (FPGA) specifically to execute the various methods according to this disclosure. For example, examples can be implemented in digital electronic circuitry, or in computer hardware, firmware, software, or in a combination thereof. In one example, a device may include a processor or processors. The processor comprises a computer-readable medium, such as a random access memory (RAM) coupled to the processor. The processor executes computer-executable program instructions stored in memory, such as executing one or more computer programs. Such processors may comprise a microprocessor, a digital signal processor (DSP), an application-specific integrated circuit (ASIC), field programmable gate arrays (FPGAs), and state machines. Such processors may further comprise programmable electronic devices such as PLCs, programmable interrupt controllers (PICs), programmable logic devices (PLDs), programmable read-only memories (PROMs), electronically programmable read-only memories (EPROMs or EEPROMs), or other similar devices.

Such processors may comprise, or may be in communication with, media, for example one or more non-transitory computer-readable media, that may store processor-executable instructions that, when executed by the processor, can cause the processor to perform methods according to this disclosure as carried out, or assisted, by a processor. Examples of non-transitory computer-readable medium may include, but are not limited to, an electronic, optical, magnetic, or other storage device capable of providing a processor, such as the processor in a web server, with processor-executable instructions. Other examples of non-transitory computer-readable media include, but are not limited to, a floppy disk, CD-ROM, magnetic disk, memory chip, ROM, RAM, ASIC, configured processor, all optical media, all magnetic tape or other magnetic media, or any other medium from which a computer processor can read. The processor, and the processing, described may be in one or more structures, and may be dispersed through one or more structures. The processor may comprise code to carry out methods (or parts of methods) according to this disclosure.

The foregoing description of some examples has been presented only for the purpose of illustration and description and is not intended to be exhaustive or to limit the disclosure to the precise forms disclosed. Numerous modifications and adaptations thereof will be apparent to those skilled in the art without departing from the spirit and scope of the disclosure.

Reference herein to an example or implementation means that a particular feature, structure, operation, or other characteristic described in connection with the example may be included in at least one implementation of the disclosure. The disclosure is not restricted to the particular examples or implementations described as such. The appearance of the phrases "in one example," "in an example," "in one implementation," or "in an implementation," or variations of the same in various places in the specification does not necessarily refer to the same example or implementation. Any particular feature, structure, operation, or other characteristic described in this specification in relation to one example or implementation may be combined with other features, structures, operations, or other characteristics described in respect of any other example or implementation.

Use herein of the word "or" is intended to cover inclusive and exclusive OR conditions. In other words, A or B or C includes any or all of the following alternative combinations as appropriate for a particular usage: A alone; B alone; C alone; A and B only; A and C only; B and C only; and A and B and C.

That which is claimed is:

1. A medication container comprising:
a storage portion enclosing a volume to store medication and having an opening providing access to the volume, and
a cap configured to releasably couple to and seal the storage portion, the cap comprising:
a printed circuit board ("PCB") having first and second sides and a set of electrical contacts comprising first and second electrical contacts;
a mechanical switch physically coupled to the PCB at a first electrical contact formed on the PCB, the mechanical switch comprising a switching member, the switching member comprising:
a coupling feature physically coupling a first end of the switching member to the PCB at the first electrical contact;
a first portion extending adjacent to the first side of the PCB from the coupling feature;
a second portion extending from the first portion through an opening through the PCB; and
a third portion extending from the second portion and adjacent to the second side of the PCB;
a second electrical contact formed on the second side of the PCB;
a signal source coupled to the other of the first or second electrical contacts;
a press plate positioned adjacent to the first portion of the switching member and the first side of the PCB, wherein the press plate applies a deflection force to the first portion of the switching member towards the PCB when the cap is coupled to the storage portion;
wherein:
the third portion of the switching member contacts the second electrical contact in a rest position to establish an electrical connection between the first and second electrical contacts,
the third portion of the switching member is biased towards the rest position based on a deformation of the coupling feature or the first portion; and
deflection of the first portion towards the PCB causes the third portion to break contact with the second electrical contact.

2. The medication container of claim 1, wherein the PCB comprises a plurality of sets of electrical contacts and the mechanical switch comprises a plurality of switching members, each switching member coupled to a first electrical contact of a respective set of electrical contacts and in contact with a second electrical contact of the respective set of electrical contacts in the rest position.

3. The medication container of claim 1, further comprising a timer physically coupled to the PCB and electrically coupled to one of the first or the second electrical contacts.

4. The medication container of claim 3, further comprising a processor physically coupled to the PCB and electrically coupled to one of the first or the second electrical contacts, wherein the processor comprises the timer.

5. The medication container of claim 4, wherein the processor is configured to receive an electrical signal from the signal source via the mechanical switch when the switching member is in the rest position.

6. The medication container of claim 5, wherein the processor is configured to detect an opening event in response to receiving the electrical signal from the signal source.

7. The medication container of claim 6, wherein the processor is further configured to keep a record of when the mechanical switch changes states and a corresponding time associated with the change in state.

8. The medication container of claim 6, wherein the cap further comprises a radio transceiver physically coupled to the PCB and electrically coupled to the processor, and wherein the processor is further configured to transmit a message using the radio transceiver in response to receiving the electrical signal from the signal source.

9. The medication container of claim 6, wherein the processor is further configured to reset a timer in response to receiving the electrical signal.

10. The medication container of claim 6, wherein the cap further comprises a visual indicator and the processor is further configured to output an output signal to activate the visual indicator in response to receiving the electrical signal.

11. The medication container of claim 10, wherein the cap further comprises a button, and wherein the visual indicator is activated in response to the button being pressed and receiving the output signal.

12. The medication container of claim 1, wherein the third portion of the switching member is angled towards the second side of the PCB from the second portion in the rest position.

13. A method comprising:
sealing a medication container, by coupling a cap of the medication container comprising a cap to a storage portion of the medication container;
changing a state of a mechanical switch based on the sealing of a medication container;
in response to the switch changing state, activating a timer disposed within the cap; and
activating a visual indicator based on an elapsed time since the activation of the timer reaching a pre-determined threshold,
wherein the cap comprises:
a printed circuit board ("PCB") having first and second sides and a set of electrical contacts comprising first and second electrical contacts;
the mechanical switch, the mechanical switch physically coupled to the PCB at a first electrical contact formed on the PCB and comprising a switching member, the switching member comprising:
a coupling feature physically coupling a first end of the switching member to the PCB at the first electrical contact;
a first portion extending adjacent to the first side of the PCB from the coupling feature;
a second portion extending from the first portion through an opening through the PCB; and
a third portion extending from the second portion and adjacent to the second side of the PCB;
a second electrical contact formed on the second side of the PCB;
a signal source coupled to the other of the first or second electrical contacts;
a timer physically coupled to the PCB and electrically coupled to one of the first or the second electrical contacts;
a press plate positioned adjacent to the first portion of the switching member and the first side of the PCB, wherein the press plate applies a deflection force to the first portion of the switching member towards the PCB when the cap is coupled to the storage portion; wherein:
the third portion of the switching member contacts the second electrical contact in a rest position to establish an electrical connection between the first and second electrical contacts,
the third portion of the switching member is biased towards the rest position based on a deformation of the coupling feature or the first portion; and
deflection of the first portion towards the PCB causes the third portion to break contact with the second electrical contact.

14. The method of claim 13, wherein activating the visual indicator is further in response to pressing a button on the cap.

15. The method of claim 13, further comprising:
removing the cap from the storage portion;
in response to removing the cap from the storage portion, changing the state of the mechanical switch;
in response to changing of the state of the mechanical switch, resetting the timer; and
in response to resetting the timer, deactivating the visual indicator.

16. The method of claim 15, wherein the cap further comprises a processor and a radio transceiver physically coupled to the PCB and electrically coupled to the processor, and wherein the processor comprises the timer,
the method further comprising transmitting a message using the radio transceiver in response to closing the mechanical switch.

17. The method of claim 13, wherein:
the PCB comprises a plurality of sets of electrical contacts and the mechanical switch comprises a plurality of switching members, each switching member coupled to a first electrical contact of a respective set of electrical contacts and in contact with a second electrical contact of the respective set of electrical contacts in the rest position, and
opening the mechanical switch comprises deflecting each of the switching members out of contact with the corresponding second electrical contact.

18. The method of claim 13, further comprising:
detecting a signal loss from each of the second electrical contacts in response to the respective switching member deflecting out of contact with the corresponding second electrical contact;
determining that each switching member has deflected out of contact with the corresponding second electrical contact based on the detected signal losses;
and wherein activating the timer disposed within the cap is in response to determining that that each switching member has deflected out of contact with the corresponding second electrical contact based on the detected signal losses.

19. The method of claim 13, further comprising:
detecting a signal loss from less than all of the second electrical contacts in response to the respective switching member deflecting out of contact with the corresponding second electrical contact;
determining that less than all switching members have deflected out of contact with the corresponding second electrical contact based on the detected signal losses; and not activating the timer disposed within the cap is in response to determining that less than all switching members have deflected out of contact with the corresponding second electrical contact based on the detected signal losses.

20. A cap assembly for a medication container, comprising:
a printed circuit board ("PCB") having first and second sides and a set of electrical contacts comprising first and second electrical contacts;
a mechanical switch physically coupled to the PCB at a first electrical contact formed on the PCB, the mechanical switch comprising a switching member, the switching member comprising:
a coupling feature physically coupling a first end of the switching member to the PCB at the first electrical contact;
a first portion extending adjacent to the first side of the PCB from the coupling feature;
a second portion extending from the first portion through an opening through the PCB; and
a third portion extending from the second portion and adjacent to the second side of the PCB;
a second electrical contact formed on the second side of the PCB;
wherein:
the third portion of the switching member contacts the second electrical contact in a rest position to establish an electrical connection between the first and second electrical contacts,
the third portion of the switching member is biased towards the rest position based on a deformation of the coupling feature or the first portion; and
deflection of the first portion towards the PCB causes the third portion to break contact with the second electrical contact.

21. The cap assembly of claim 20, wherein the PCB further comprises a plurality of sets of electrical contacts and the mechanical switch comprises a plurality of switching members, each switching member coupled to a first electrical contact of a respective set of electrical contacts and in contact with a second electrical contact of the respective set of electrical contacts in the rest position.

22. The cap assembly of claim 20, further comprising a timer physically coupled to the PCB and electrically coupled to one of the first or the second electrical contacts.

23. The cap assembly of claim 22, further comprising a processor physically coupled to the PCB and electrically coupled to one of the first or the second electrical contacts, wherein the processor comprises the timer.

24. A medication container comprising:
a storage portion enclosing a volume to store medication and having an opening providing access to the volume, and
a cap configured to releasably couple to and seal the storage portion, the cap comprising:
a printed circuit board ("PCB") having a first side, a second side, and a set of electrical contacts comprising first and second electrical contacts;
a mechanical switch physically coupled to the PCB at a first electrical contact formed on the PCB, the mechanical switch comprising a switching member, the switching member comprising a coupling feature physically coupling a first end of the switching member to the PCB at the first electrical contact and extending adjacent to the first side of the PCB from the coupling feature towards the second electrical contact, a second end of the switching member in contact with the second electrical contact when the switching member is in a rest position;

a signal source coupled to the second electrical contact;

a press plate positioned adjacent to the PCB and comprising at least one protrusion, wherein the protrusion is configured to extend through a corresponding cutout in the PCB to deflect the switching member away from the PCB when the cap is coupled to the storage portion;

wherein:

the switching member is biased towards the rest position; and deflection of the switching member away from the PCB causes the switching member to break contact with the second electrical contact.

* * * * *

UNITED STATES PATENT AND TRADEMARK OFFICE
CERTIFICATE OF CORRECTION

| | | |
|---|---|---|
| PATENT NO. | : 12,083,069 B1 | Page 1 of 1 |
| APPLICATION NO. | : 17/406952 | |
| DATED | : September 10, 2024 | |
| INVENTOR(S) | : Steyn et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 573 days.

Signed and Sealed this
Thirtieth Day of September, 2025

John A. Squires
*Director of the United States Patent and Trademark Office*